(12) United States Patent
Park et al.

(10) Patent No.: US 9,985,106 B2
(45) Date of Patent: May 29, 2018

(54) SEMICONDUCTOR DEVICES UTILIZING SPACER STRUCTURES

(71) Applicant: Samsung Electronics Co., Ltd., Suwon-si, Gyeonggi-do (KR)

(72) Inventors: Sang Jine Park, Suwon-si (KR); Yong Sun Ko, Suwon-si (KR); In Seak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/420,436

(22) Filed: Jan. 31, 2017

(65) Prior Publication Data

US 2018/0040707 A1 Feb. 8, 2018

(30) Foreign Application Priority Data

Aug. 4, 2016 (KR) .................. 10-2016-0099376

(51) Int. Cl.
| | |
|---|---|
| H01L 29/49 | (2006.01) |
| H01L 29/06 | (2006.01) |
| H01L 29/66 | (2006.01) |
| H01L 27/08 | (2006.01) |
| H01L 27/088 | (2006.01) |
| H01L 21/8234 | (2006.01) |

(52) U.S. Cl.
CPC .. *H01L 29/4991* (2013.01); *H01L 21/823431* (2013.01); *H01L 21/823468* (2013.01); *H01L 21/823481* (2013.01); *H01L 27/0886* (2013.01); *H01L 29/0653* (2013.01); *H01L 29/66545* (2013.01); *H01L 29/6656* (2013.01)

(58) Field of Classification Search
CPC ............. H01L 29/4991; H01L 29/0653; H01L 29/66545; H01L 27/0886; H01L 29/6656
See application file for complete search history.

(56) References Cited

U.S. PATENT DOCUMENTS

| | | | | |
|---|---|---|---|---|
| 5,223,447 A | * | 6/1993 | Lee | ................... H01L 27/10861 257/E21.008 |
| 5,981,345 A | * | 11/1999 | Ryum | ................. H01L 29/1054 257/E21.409 |
| 9,029,920 B2 | * | 5/2015 | Xie | ....................... H01L 21/283 257/288 |
| 9,190,487 B2 | | 11/2015 | Khakifirooz et al. | |
| 9,293,532 B2 | | 3/2016 | Cheng et al. | |
| 9,379,004 B1 | * | 6/2016 | Kwon | ................. H01L 27/1052 |
| 9,570,609 B2 | * | 2/2017 | Obradovic | .......... H01L 29/7845 |
| 9,590,038 B1 | * | 3/2017 | Kim | ................. H01L 29/42392 |
| 9,755,034 B2 | * | 9/2017 | Kim | ................. H01L 29/42392 |
| 2015/0064855 A1 | | 3/2015 | Cheng et al. | |
| 2015/0206952 A1 | | 7/2015 | Lin et al. | |
| 2015/0236132 A1 | | 8/2015 | Chang et al. | |
| 2015/0333155 A1 | | 11/2015 | Liu et al. | |
| 2015/0340491 A1 | | 11/2015 | Zang et al. | |
| 2016/0064567 A1 | | 3/2016 | Ho et al. | |

(Continued)

*Primary Examiner* — Ida M Soward
(74) *Attorney, Agent, or Firm* — Myers Bigel, P.A.

(57) ABSTRACT

Semiconductor devices may include a field insulating layer that is on a substrate, a gate structure that is on the substrate and separated from the field insulating layer, a first spacer structure that is on sidewalls and a lower surface of the gate structure and is separated from the field insulating layer, and a second spacer structure that is on a part of an upper surface of the field insulating layer that is overlapped by the gate structure.

10 Claims, 26 Drawing Sheets

(56) References Cited

U.S. PATENT DOCUMENTS

| | | |
|---|---|---|
| 2016/0099342 A1 | 4/2016 | Basker et al. |
| 2017/0005166 A1* | 1/2017 | Park .................... H01L 29/0649 |
| 2017/0110554 A1* | 4/2017 | Tak .................... H01L 29/4991 |
| 2017/0162651 A1* | 6/2017 | Suk .................... H01L 29/0673 |

* cited by examiner

SEMICONDUCTOR DEVICES UTILIZING SPACER STRUCTURES

This application claims priority under 35 USC § 119 to Korean Patent Application No. 10-2016-0099376, filed on Aug. 4, 2016, in the Korean Intellectual Property Office, the entire contents of which are herein incorporated by reference.

BACKGROUND

1. Field

The present inventive concepts relate to semiconductor devices.

2. Description of the Related Art

A multi-gate transistor may be used as one of the scaling techniques for increasing the density of a semiconductor device. The multi-gate transistor may be obtained by forming a fin-shaped silicon body on a substrate and forming a gate on a surface of the silicon body.

The multi-gate transistor can be scaled because it uses a three-dimensional (3D) channel. In addition, the current control capability of the multi-gate transistor can be improved without the need to increase the gate length of the multi-gate transistor. Moreover, it is possible to effectively suppress a short channel effect (SCE) in the multi-gate transistor in which an electric potential of a channel region is affected by a drain voltage.

SUMMARY

Aspects of the inventive concepts provide semiconductor devices having improved reliability and operation characteristics due to a spacer structure formed on a field insulating layer to cover sidewalls and a lower surface of a gate electrode.

According to an aspect of the inventive concepts, there is provided a semiconductor device including a field insulating layer that is on a substrate, a gate structure that is on the substrate and separated from the field insulating layer, a first spacer structure that is on sidewalls and a lower surface of the gate structure and is separated from the field insulating layer, and a second spacer structure that is on a part of an upper surface of the field insulating layer that is overlapped by the gate structure.

According to another aspect of the inventive concepts, there is provided a semiconductor device including a first fin pattern and a second fin pattern that are on a substrate and are adjacent to each other, a field insulating layer that is on the substrate between the first fin pattern and the second fin pattern, and that covers part of the first fin pattern and part of the second fin pattern, a first gate structure and a second gate structure that are on the field insulating layer, intersect the first fin pattern and the second fin pattern, and are adjacent to each other, and a first spacer structure that is on a lower surface of the first gate structure in an area in which the first gate structure overlaps the field insulating layer and that is separated from the field insulating layer.

According to still another aspect of the inventive concepts, there is provided a semiconductor device including a first fin pattern and a second fin pattern which are formed on a substrate to be adjacent to each other, a field insulating layer which is formed on the substrate between the first fin pattern and the second fin pattern and is on part of the first fin pattern and part of the second fin pattern, a first gate structure and a second gate structure which are formed on the field insulating layer, intersect the first fin pattern and the second fin pattern, and are adjacent to each other, and a first spacer structure which is formed on a lower surface of each of the first and second gate structures in an area in which each of the first and second gate structures overlaps the field insulating layer and which is separated from the field insulating layer.

According to still another aspect of the inventive concepts, there is provided a semiconductor device including a substrate, a first fin pattern and a second fin pattern protruding from the substrate, a field insulating layer that is on the substrate between the first fin pattern and the second fin pattern, a gate structure between the first fin pattern and the second fin pattern, a first spacer structure between the gate structure and the field insulating layer, a second spacer structure that is between the first spacer structure and the field insulating layer and that is separated from the first spacer structure, and an interlayer insulating film between the first spacer structure and the second spacer structure.

However, aspects of the inventive concepts are not restricted to the one set forth herein. The above and other aspects of the inventive concepts will become more apparent to one of ordinary skill in the art to which the inventive concepts pertain by referencing the detailed description of the inventive concepts given below.

BRIEF DESCRIPTION OF THE DRAWINGS

These and/or other aspects of the inventive concepts will become apparent and more readily appreciated from the following description of the embodiments, taken in conjunction with the accompanying drawings in which.

DETAILED DESCRIPTION

Hereinafter, semiconductor devices and methods of fabricating semiconductor devices according to embodiments of the inventive concepts will be described with reference to FIGS. 1 through 23.

Figure 1:
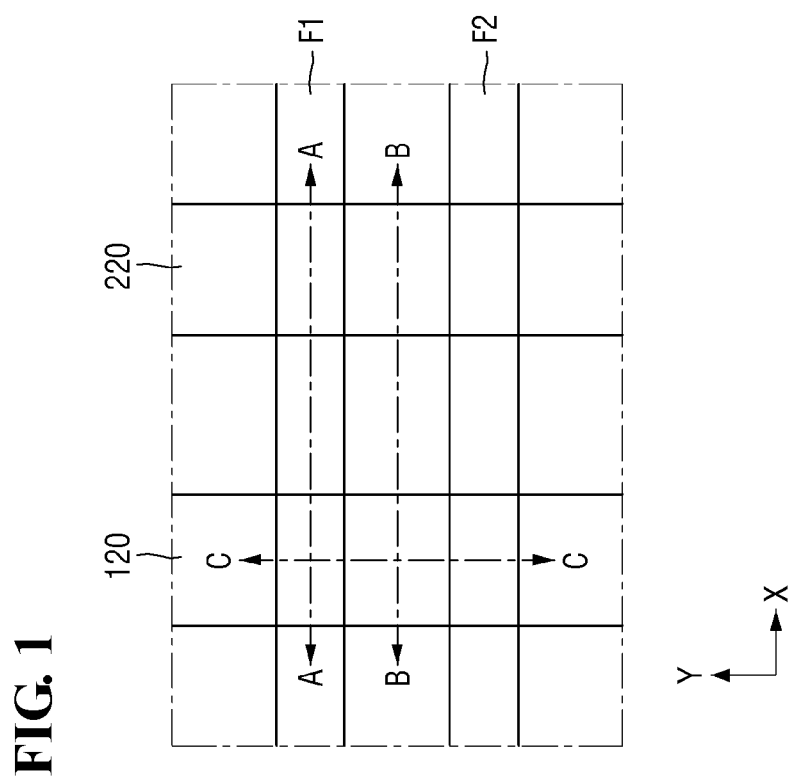
FIG. 1 is a layout view of a semiconductor device according to embodiments of the inventive concepts.
Figure 2A:
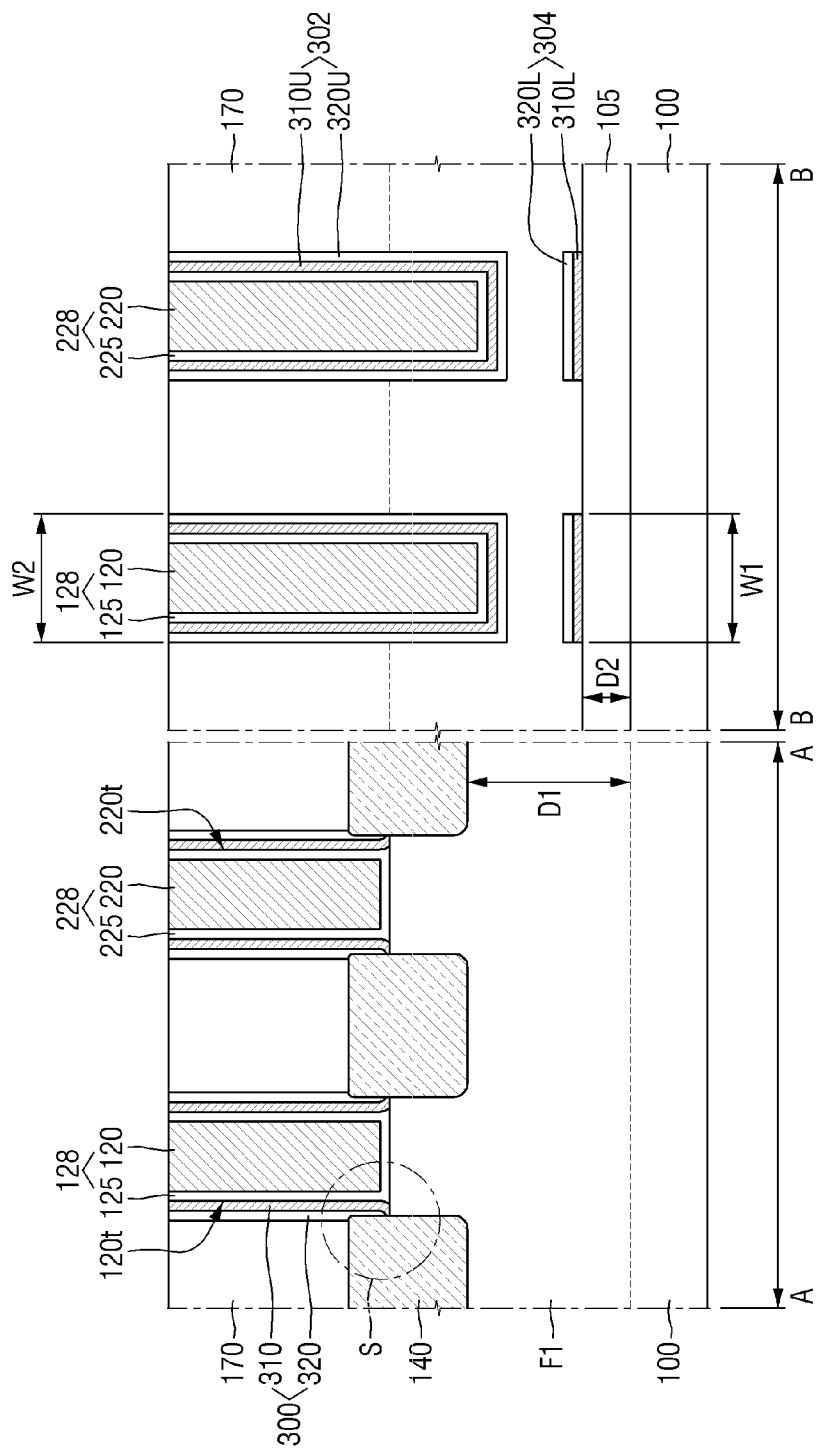
FIG. 2A is a cross-sectional view taken along the lines A-A and B-B of FIG. 1.
Figure 2B:
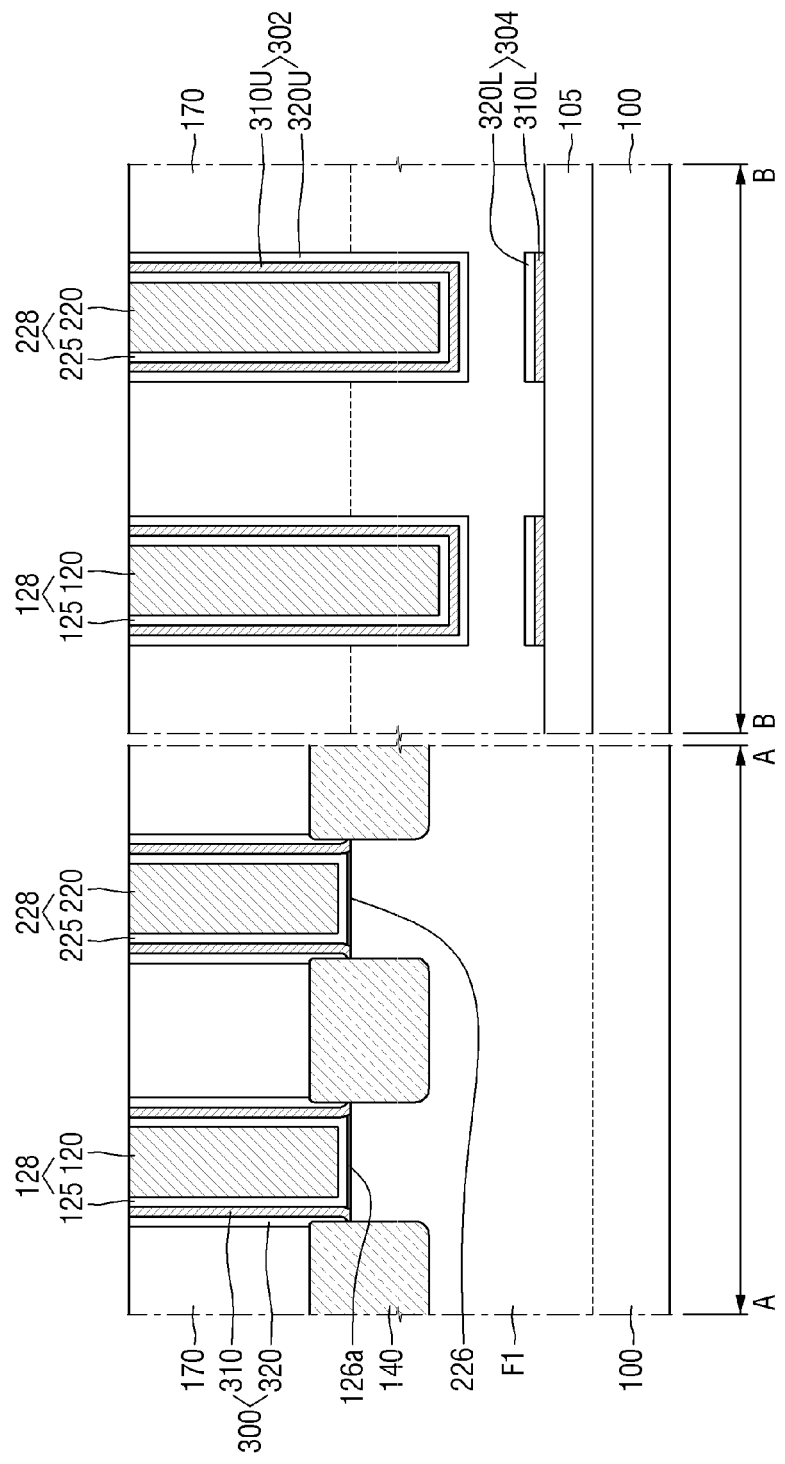
FIG. 2B illustrates the embodiment of FIG. 2A further including interfacial layers.
Figure 3A:
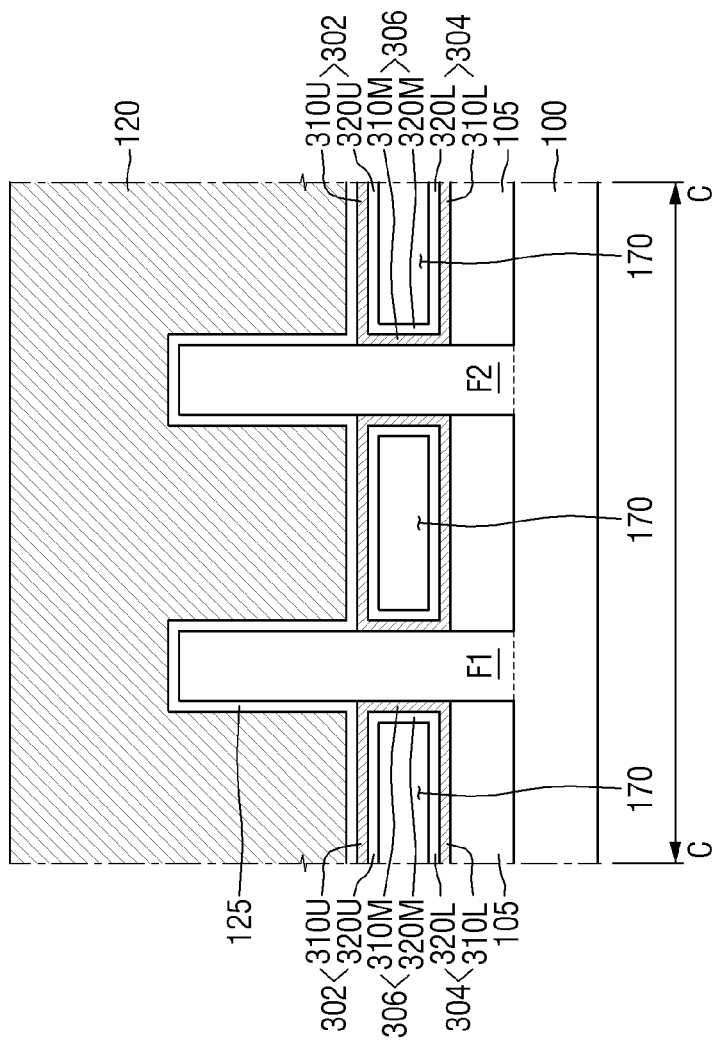
FIG. 3A is a cross-sectional view taken along the line C-C of FIG. 1.
Figure 3B:
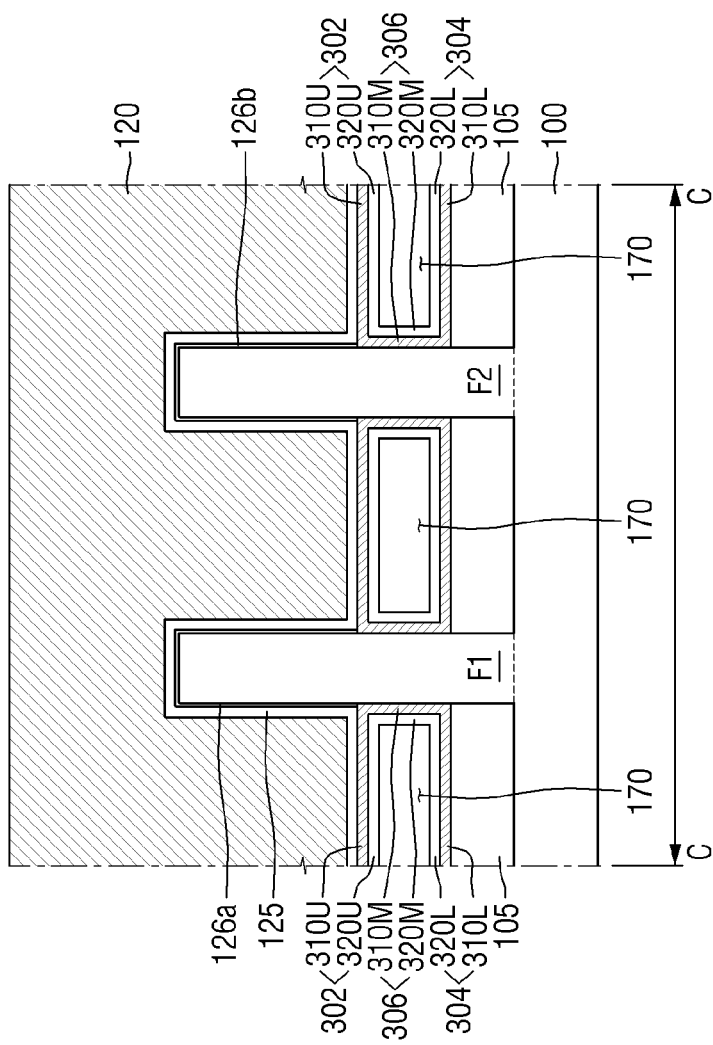
FIG. 3B illustrates the embodiment of FIG. 3A further including interfacial layers.
Figure 4A:
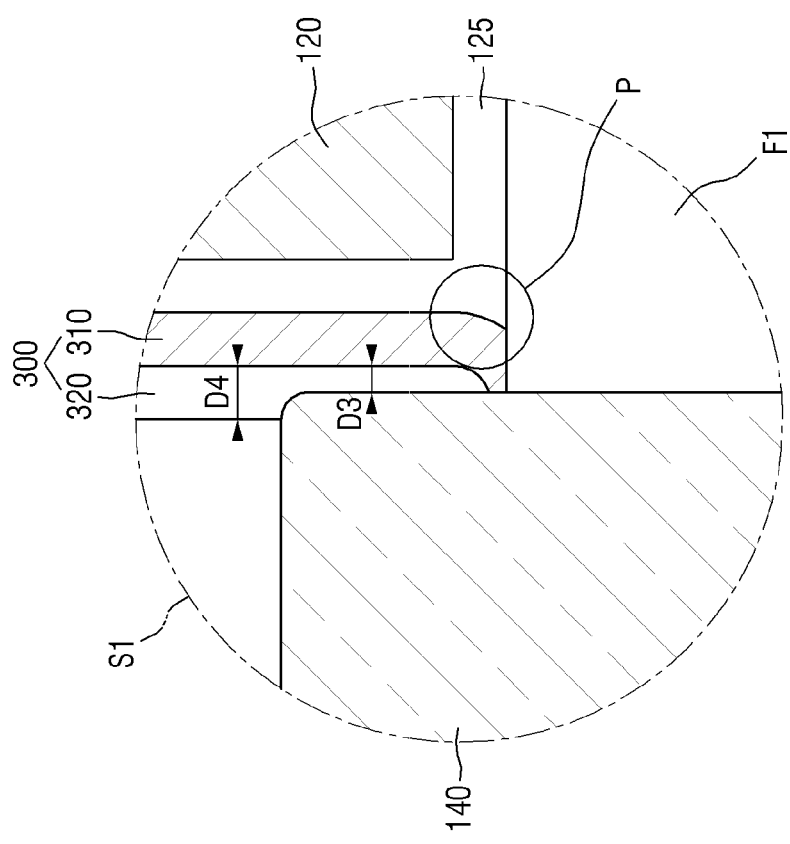
FIGS. 4A and 4B are partial enlarged views of an area 'S' of FIG. 2A.
Figure 4B:
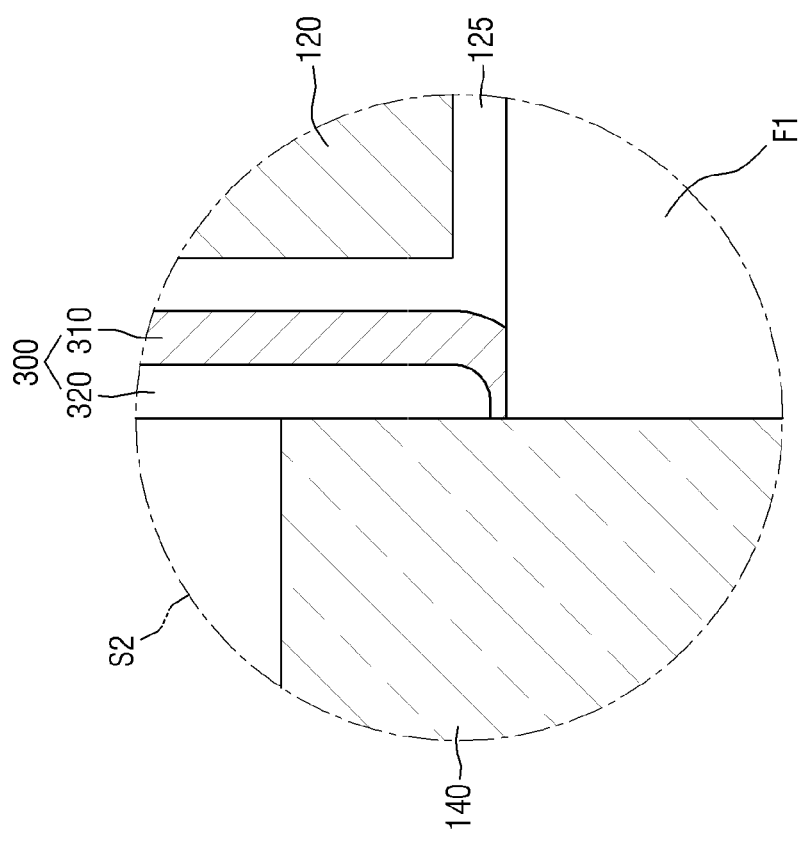

FIG. 1 is a layout view of a semiconductor device according to embodiments of the inventive concepts. FIGS. 2A and 2B are cross-sectional views taken along the lines A-A and B-B of FIG. 1. FIG. 2B illustrates the embodiment of FIG. 2A further including interfacial layers. FIGS. 3A and 3B are cross-sectional views taken along the line C-C of FIG. 1. FIG. 3B illustrates the embodiment of FIG. 3A further including interfacial layers. FIGS. 4A and 4B are partial enlarged views of an area 'S' of FIG. 2A.

Referring to FIGS. 1 through 4B, the semiconductor device according to the embodiments of the inventive concepts may include a substrate 100, a field insulating layer 105, a first fin pattern F1, a second fin pattern F2, a first gate structure 128, a second gate structure 228, a gate spacer 300, a first spacer structure 302, a second spacer structure 304, and an epitaxial pattern 140.

The first gate structure 128 may include a first gate electrode 120 and a first gate insulating layer 125, and the second gate structure 228 may include a second gate electrode 220 and a second gate insulating layer 225.

The substrate 100 may be a bulk silicon substrate or a silicon-on-insulator (SOL) substrate. In some embodiments, the substrate 100 may be, but is not limited to, a silicon substrate or a substrate made of another material such as silicon germanium, silicon germanium-on-insulator (SGOI), indium antimonide, lead telluride, indium arsenide, indium phosphide, gallium arsenide and/or gallium antimonide.

The first fin pattern F1 may be formed on the substrate 100 to extend along a first direction X. The first fin pattern F1 may protrude from the substrate 100.

The second fin pattern F2 may be formed on the substrate 100 to extend along the first direction X. The second fin pattern F2 may protrude from the substrate 100.

The first fin pattern F1 and the second fin pattern F2 may be formed adjacent to each other. The first fin pattern F1 and the second fin pattern F2 may be formed side by side with each other. That is, the first fin pattern F1 and the second fin pattern F2 may be arranged in a second direction Y.

More specifically, each of the first fin pattern F1 and the second fin pattern F2 may include long sides extending along the first direction X and short sides extending along the second direction Y. The long sides of the first fin pattern F1 may face the long sides of the second fin pattern F2.

Each of the first fin pattern F1 and the second fin pattern F2 may be part of the substrate 100 and include an epitaxial layer grown from the substrate 100.

Each of the first fin pattern F1 and the second fin pattern F2 may include an element semiconductor material such as silicon and/or germanium. In addition, each of the first fin pattern F1 and the second fin pattern F2 may include a compound semiconductor such as a group IV-IV compound semiconductor or a group III-V compound semiconductor.

Specifically, the group IV-IV compound semiconductor that forms each of the first fin pattern F1 and the second fin pattern F2 may be, e.g., a binary or ternary compound including two or more of carbon (C), silicon (Si), germanium (Ge) and tin (Sn) or a compound obtained by doping the binary or ternary compound with a group IV element.

The group III-V compound semiconductor that forms each of the first fin pattern F1 and the second fin pattern F2 may be, e.g., a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

The first fin pattern F1 and the second fin pattern F2 included in the semiconductor device according to the embodiments will be described as silicon fin patterns that include silicon.

In the semiconductor device described using FIGS. 1 through 4B, the first fin pattern F1 and the second fin pattern F2 may respectively include channel regions of transistors of the same type.

The field insulating layer 105 may be formed on the substrate 100. The field insulating layer 105 may be formed between the first fin pattern F1 and the second fin pattern F2.

The field insulating layer 105 may partially cover the first fin pattern F1 and the second fin pattern F2. The field insulating layer 105 may partially cover sidewalls of the first fin pattern F1 and sidewalls of the second fin pattern F2. In some embodiments, the field insulating layer 105 may cover lower parts of the sidewalls of the first and second fin patterns F1 and F2 and an upper surface of the substrate 100 and may be separated from a lower surface of the first gate electrode 120 or a lower surface of the second gate electrode 220. That is, the first gate electrode 120 or the second gate electrode 220 may not contact the field insulating layer 105.

As will be described in detail herein, the first spacer structure 302, the second spacer structure 304, and a third spacer structure 306 may be formed between the first gate electrode 120 or the second gate electrode 220 and the field insulating layer 105.

The field insulating layer 105 may include at least one of, e.g., a silicon oxide layer, a silicon nitride layer, a silicon oxynitride layer, a low-k material, and combinations of the same. Examples of the low-k material may include, but not limited to, flowable oxide (FOX), tonen silazen (TOSZ), undoped silicate glass (USG), borosilicate glass (BSG), phosphosilicate glass (PSG), borophosphosilicate glass (BPSG), plasma enhanced tetraethylorthosilicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, and combinations of the same.

In addition, although not specifically illustrated in the drawings, the field insulating layer 105 may further include at least one field liner layer formed between the first fin pattern F1 and the field insulating layer 105 and between the second fin pattern F2 and the field insulating layer 105.

The field liner layer included in the field insulating layer 105 may include at least one of polysilicon, amorphous silicon, silicon oxynitride, silicon nitride, and silicon oxide.

Each of the first gate electrode 120 and the second gate electrode 220 may extend along the second direction Y. Each of the first gate electrode 120 and the second gate electrode 220 may intersect the first fin pattern F1 and the second fin pattern F2. The first gate electrode 120 and the second gate electrode 220 may be formed adjacent to each other.

The first gate electrode 120 and the second gate electrode 220 may be formed on the first fin pattern F1 and the second fin pattern F2. Each of the first gate electrode 120 and the second gate electrode 220 may cover the first fin pattern F1 and the second fin pattern F2 which protrude further upward than an upper surface of the field insulating layer 105.

Here, when an element or layer is referred to as being "on" the field insulating layer 105, it can be directly on the field insulating layer 105 or intervening elements or layers may be present.

The first gate electrode 120 and the second gate electrode 220 located on the field insulating layer 105 may not contact the field insulating layer 105, that is, may be separated from the field insulating layer 105.

Each of the first gate electrode 120 and the second gate electrode 220 may include at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel-platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations of the same.

Each of the first gate electrode 120 and the second gate electrode 220 may include conductive metal oxide, conductive metal oxynitride, and/or an oxidized form of one of the above materials.

The first gate electrode 120 and the second gate electrode 220 may be formed by, but not limited to, a replacement process (or a gate last process).

The gate spacer 300 may be formed on sidewalls of the first gate electrode 120 or the second gate electrode 220. The gate spacer 300 may be disposed on at least one side of the first gate electrode 120 or the second gate electrode 220. Specifically, the gate spacer 300 may be disposed on both sides of the first gate electrode 120 or the second gate electrode 220 as illustrated in FIG. 2A. In FIG. 2A, a side surface of the gate spacer 300 is 'I'-shaped. However, the shape of the side surface of the gate spacer 300 is not limited to the 'I' shape and can be changed as desired. In some embodiments, the shape of the gate spacer 300 may be changed to, e.g., a curved shape or an 'L' shape.

The gate spacer 300 may include a plurality of spacer layers. In the semiconductor devices described using FIGS. 1 through 4B, the gate spacer 300 may include a first spacer layer 310 and a second spacer layer 320.

The first spacer layer 310 may be formed along sidewalls of the first gate structure 128 or the second gate structure 228. Specifically, the first spacer layer 310 may contact the sidewalls of the first gate structure 128 or the second gate structure 228. The first spacer layer 310 may be formed conformally along the sidewalls of the first gate structure 128 or the second gate structure 228.

Likewise, the second spacer layer 320 may be formed along the sidewalls of the first gate structure 128 or the second gate structure 228 and along an outer surface of the first spacer layer 310. The second spacer layer 320 may also be formed conformally along the first spacer layer 310.

Each of the first spacer layer 310 and the second spacer layer 320 may include at least one of, e.g., silicon nitride (SiN), silicon oxynitride (SiON), silicon oxide (SiO$_2$), silicon oxycarbonitride (SiOCN), and combinations of the same.

In addition, the first spacer layer 310 and the second spacer layer 320 may include different materials. For example, the first spacer layer 310 may include, but is not limited to, silicon nitride (SiN), and the second spacer layer 320 may include, but is not limited to, silicon oxycarbonitride (SiOCN).

In FIG. 2A, the first spacer structure 302 may cover the sidewalls and a lower surface of the first gate structure 128 or the second gate structure 228. Specifically, the first spacer structure 302, as seen in the B-B cross-section, may completely cover both sidewalls and the lower surface of the first gate structure 128 or the second gate structure 228. Here, the first spacer structure 302 may be separated from the field insulating layer 105. The first spacer structure 302 may be formed conformally along the sidewalls and the lower surface of the first gate electrode 120 or the second gate electrode 220.

The first spacer structure 302 may include a plurality of spacer layers. In the semiconductor device described using FIGS. 1 through 4B, the first spacer structure 302 may include a first spacer upper layer 310U and a second spacer upper layer 320U.

The first spacer upper layer 310U may contact the first gate structure 128 or the second gate structure 228, and the second spacer upper layer 320U may be formed along an outer surface of the first spacer upper layer 310U. That is, the first spacer upper layer 310U may be disposed on an inner side of the first spacer structure 302, and the second spacer upper layer 320U may be disposed on an outer side of the first spacer structure 302.

Each of the first spacer upper layer 310U and the second spacer upper layer 320U may include at least one of, e.g., silicon nitride (SiN), silicon oxynitride (SiON), silicon oxide (SiO$_2$), silicon oxycarbonitride (SiOCN), and combinations of the same.

In addition, the first spacer upper layer 310U and the second spacer upper layer 320U may include different materials. Specifically, the first spacer upper layer 310U may include the same material as the first spacer layer 310 and be formed by the same process as the first spacer layer 310. Likewise, the second spacer upper layer 320U may include the same material as the second spacer layer 320 and may be formed by the same process as the second spacer layer 320.

The second spacer structure 304 may be formed under the first spacer structure 302 and the first gate structure 128 or the second gate structure 228. The second spacer structure 304 may be formed on the field insulating layer 105 and contact the upper surface of the field insulating layer 105. Specifically, the second spacer structure 304 may be formed only on a part of the upper surface of the field insulating layer 105 which is overlapped by the first spacer structure 302 and the first gate structure 128 or overlapped by the first spacer structure 302 and the second gate structure 228. That is, the second spacer structure 304 may not be formed on at least a part of the field insulating layer 105.

A width W1 of an upper surface of the second spacer structure 304 may be substantially equal to a width W2 of a lower surface of the first spacer structure 302. However, the inventive concepts are not limited thereto, and the width W1 of the upper surface of the second spacer structure 304 can also be smaller than the width W2 of the lower surface of the first spacer structure 302. This will be described in detail herein with reference to FIG. 8.

The second spacer structure 304 may be formed conformally along the upper surface of the field insulating layer 105. A thickness from the upper surface of the field insulating layer 105 to the upper surface of the second spacer structure 304 may be uniform, but the embodiments of the inventive concepts are not limited thereto.

The second spacer structure 304 may include a plurality of spacer layers. In the semiconductor devices described using FIGS. 1 through 4B, the second spacer structure 304 may include a first spacer lower layer 310L and a second spacer lower layer 320L.

The first spacer lower layer 310L may contact the upper surface of the field insulating layer 105, and the second spacer lower layer 320L may be formed along an upper surface of the first spacer lower layer 310L. That is, the first spacer lower layer 310L may be disposed in a lower part of the second spacer structure 304, and the second spacer lower layer 320L may be disposed in an upper part of the second spacer structure 304.

Each of the first spacer lower layer 310L and the second spacer lower layer 320L may include at least one of, e.g., silicon nitride (SiN), silicon oxynitride (SiON), silicon oxide ($SiO_2$), silicon oxycarbonitride (SiOCN), and combinations of the same.

In addition, the first spacer lower layer 310L and the second spacer lower layer 320L may include different materials. Specifically, the first spacer lower layer 310L may include the same material as the first spacer upper layer 310U and may be formed by the same process as the first spacer upper layer 310U. Likewise, the second spacer lower layer 320L may include the same material as the second spacer upper layer 320U and may be formed by the same process as the second spacer upper layer 320U.

Referring to FIG. 3A, the semiconductor devices described using FIGS. 1 through 4B may further include the third spacer structure 306. The third spacer structure 306 may be formed on part of the sidewalls of the first fin pattern F1 and/or the second fin pattern F2 and connect the first spacer structure 302 and the second spacer structure 304.

The third spacer structure 306 may include a plurality of spacer layers. In the semiconductor devices described using FIGS. 1 through 4B, the third spacer structure 306 may include a first spacer middle layer 310M and a second spacer middle layer 320M.

The first spacer middle layer 310M may contact the sidewalls of the first fin pattern F1 or the second fin pattern F2, and the second spacer middle layer 320M may be formed along a surface of the first spacer middle layer 310M. In some embodiments, the first spacer middle layer 310M may be disposed between the second spacer middle layer 320M and the sidewalls of the first fin pattern F1 or the second fin pattern F2.

Each of the first spacer middle layer 310M and the second spacer middle layer 320M may include at least one of, e.g., silicon nitride (SiN), silicon oxynitride (SiON), silicon oxide ($SiO_2$), silicon oxycarbonitride (SiOCN), and combinations of the same.

In addition, the first spacer middle layer 310M and the second spacer middle layer 320M may include different materials. Specifically, the first spacer middle layer 310M may include the same material as the first spacer upper layer 310U and the first spacer lower layer 310L and may be formed by the same process as the first spacer upper layer 310U and the first spacer lower layer 310L. Likewise, the second spacer middle layer 320M may include the same material as the second spacer upper layer 320U and the second spacer lower layer 320L and may be formed by the same process as the second spacer upper layer 320U and the second spacer lower layer 320L.

An interlayer insulating film 170 may be formed inside a structure composed of the first, second and third spacer structures 302, 304 and 306. That is, the interlayer insulating film 170 may be formed between the first spacer structure 302 and the second spacer structure 304.

The interlayer insulating film 170 may completely cover an outer surface of the first spacer structure 302, an outer surface of the second spacer structure 304, and an outer surface of the third spacer structure 306.

In some embodiments, the first spacer structure 302 and the second spacer structure 304 may have the same thickness. The third spacer structure 306 may also have, but is not limited to, the same thickness as the first spacer structure 302 and the second spacer structure 304. In some embodiments, the third spacer structure 306 may have a different thickness than the first spacer structure 302 and the second spacer structure 304.

The first gate insulating layer 125 may be formed between the first fin pattern F1 and the first gate electrode 120 and between the second fin pattern F2 and the first gate electrode 120. The first gate insulating layer 125 may be formed along profiles of the first fin pattern F1 and the second fin pattern 12 which protrude further upward than the field insulating layer 105 and the first spacer structure 302.

The first gate insulating layer 125 may be formed between the gate spacer 300 and the first gate electrode 120. The first gate insulating layer 125 may be formed along sidewalls and a bottom surface of a first trench 120t. The first gate insulating layer 125 may be disposed between the first gate electrode 120 and the first spacer structure 302.

The second gate insulating layer 225 may be formed between the first fin pattern F1 and the second gate electrode 220 and between the second fin pattern F2 and the second gate electrode 220. The second gate insulating layer 225 may be formed along the profiles of the first fin pattern F1 and the second fin pattern F2 which protrude further upward than the field insulating layer 105 and the first spacer structure 302.

The second gate insulating layer 225 may be disposed between the second gate electrode 220 and the first spacer structure 302. The second gate insulating layer 225 may be formed along sidewalls and a bottom surface of a second trench 220t. The second gate insulating layer 225 may be formed between the gate spacer 300 and the second gate electrode 220.

Referring to FIGS. 2B and 3B, first interfacial layers 126a and 126b may further be formed between the first gate insulating layer 125 and the first fin pattern F1 and the second fin pattern F2. That is, the first interfacial layer 126a may further be formed between the first gate insulating layer 125 and the first fin pattern F1, and the first interfacial layer 126b may further be formed between the first gate insulating layer 125 and the second fin pattern F2. In addition, a second interfacial layer 226 may further be formed between the second gate insulating layer 225 and the first fin pattern F1, and between the second gate insulating layer 225 and the second fin pattern F2.

When the first fin pattern F1 and the second fin pattern F2 are silicon fin patterns, each of the first interfacial layer 126a and 126b and the second interfacial layer 226 may include, e.g., silicon oxide.

In FIGS. 2B and 3B, the first interfacial layers 126a and 126b and the second interfacial layer 226 may be formed along the profiles of the first fin pattern F1 and the second fin pattern F2 which protrude upward than an upper surface of the first spacer structure 302. However, the inventive concepts are not limited thereto.

The first interfacial layers 126a and 126b and the second interfacial layer 226 can also be formed to extend along the upper surface of the first spacer structure 302 depending on a method of forming the first interfacial layers 126a and 126b and the second interfacial layer 226.

For ease of description, the following description will be made using drawings in which the first interfacial layers 126a and 126b and the second interfacial layer 226 are not illustrated.

The first gate insulating layer 125 and the second gate insulating layer 225 may include a high-k material having a higher dielectric constant than a silicon oxide layer. For example, the first gate insulating layer 125 and/or the second gate insulating layer 225 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

In addition, while the first gate insulating layer 125 and the second gate insulating layer 225 have been described as being made of oxides, they can also include one or more of, but not limited to, nitrides (e.g., hafnium nitride) and oxynitrides (e.g., hafnium oxynitride) of the above metallic materials.

The epitaxial pattern 140 may be formed on a side of each of the first gate electrode 120 and the second gate electrode 220. The epitaxial pattern 140 may be formed on the first fin pattern F1.

The epitaxial pattern 140 may be included in source/drain regions of a transistor that uses the first fin pattern F1 as a channel region. The epitaxial pattern 140 may be a semiconductor pattern.

When each of the first fin pattern F1 and the second fin pattern F2 includes a channel region of a p-channel metal oxide semiconductor (PMOS) transistor, the epitaxial pattern 140 may include a compressive stress material. For example, the compressive stress material may be a material (e.g., SiGe) having a greater lattice constant than Si. The compressive stress material can improve the mobility of carriers in a channel region by applying compressive stress to the first fin pattern F1 and the second fin pattern F2.

In some embodiments, when each of the first fin pattern F1 and the second fin pattern F2 includes a channel region of an n-channel metal oxide semiconductor (NMOS) transistor, the epitaxial pattern 140 may include a tensile stress material. For example, when each of the first fin pattern F1 and the second fin pattern F2 is Si, the epitaxial pattern 140 may be a material (e.g., SiC) having a smaller lattice constant than Si. The tensile stress material can improve the mobility of carriers in a channel region by applying tensile stress to the first fin pattern F1 and the second fin pattern F2.

In some embodiments, when each of the first fin pattern F1 and the second fin pattern F2 is Si, the epitaxial pattern 140 may be a silicon epitaxial pattern.

In FIG. 2A, a distance D1 from the upper surface of the substrate 100 to a lower surface of the epitaxial pattern 140 may be greater than a distance D2 from the upper surface of the substrate 100 to the upper surface of the field insulating layer 105. That is, a bottom surface of a semiconductor pattern including the epitaxial pattern 140 may be located further away from the substrate 100 than from the upper surface of the field insulating layer 105. However, the inventive concepts are not limited thereto.

Referring to FIG. 4A, a part of the epitaxial pattern 140 may overlap a part of the gate spacer 300. That is, a sidewall of the epitaxial pattern 140 may be located closer to the first gate electrode 120 than a sidewall of the gate spacer 300. Therefore, in an area in which the epitaxial pattern 140 overlaps the second spacer layer 320 included in the gate spacer 300, a distance D3 between the epitaxial pattern 140 and the first spacer layer 310 may be smaller than a maximum thickness D4 (e.g., a thickness measured in a direction parallel to the upper surface of the first fin pattern F1) of the second spacer layer 320.

However, the inventive concepts are not limited thereto. Referring to FIG. 4B, a part of the epitaxial pattern 140 may not overlap a part of the gate spacer 300. That is, the sidewall of the epitaxial pattern 140 and the sidewall of the gate spacer 300 may be aligned collinearly.

In addition, referring to an area 'P' of FIG. 4A, the gate spacer 300 may be bent or curved in a direction away from the first gate electrode 120 at a portion which contacts the first fin pattern F1. Accordingly, the first spacer layer 310 and the second spacer layer 320 included in the gate spacer 300 may be bent or curved in the direction away from the first gate electrode 120 at their respective portions which contact the first fin pattern F1.

The interlayer insulating film 170 may be formed on the field insulating layer 105. The interlayer insulating film 170 may cover the epitaxial pattern 140, an outer surface of the gate spacer 300, an outer surface of the first spacer structure 302, and an outer surface of the second spacer structure 304.

Specifically, the interlayer insulating film 170 may be located between the first spacer structure 302 and the second spacer structure 304. In addition, the interlayer insulating film 170 may completely cover outer sidewalls and a lower surface of the first spacer structure 302 and outer sidewalls and an upper surface of the second spacer structure 304. In some embodiments, the interlayer insulating film 170 may cover sidewalls of the third spacer structure 306.

In the semiconductor device according to the embodiments, an upper surface of the first gate electrode 120 and an upper surface of the second gate electrode 220 may lie in the same plane with an upper surface of the interlayer insulating film 170.

The interlayer insulating film 170 may include, but is not limited to, silicon oxide, silicon nitride, silicon oxynitride, flowable oxide (FOX), tonen silazen (TOSZ), undoped silicate glass (USG), borosilicate glass (BSG), phosphosilicate glass (PSG), borophosphosilicate glass (BPSG), plasma enhanced tetraethylorthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, or any combination of the same.

While FIGS. 1 through 4B have been described above using a plurality of fin patterns and a plurality of gate electrodes intersecting the fin patterns, the inventive concepts are not limited thereto.

That is, the inventive concepts can also be applied to a single fin pattern and a single gate electrode intersecting the single fin pattern. In addition, the inventive concepts can be applied to a single fin pattern and a plurality of gate electrodes intersecting the single fin pattern and to a plurality of fin patterns and a single gate electrode intersecting the fin patterns.

In the drawings related to the semiconductor devices according to the embodiments, a fin field effect transistor (FinFET) including a channel region of a fin pattern shape is illustrated. However, the inventive concepts are not limited to the FinFET. The semiconductor devices according to the embodiments of the inventive concepts can also include a tunneling FET, a transistor including nanowires, a transistor including a nano sheet, and/or a three-dimensional (3D) transistor. In addition, the semiconductor devices according to the embodiments of the inventive concepts can include a bipolar junction transistor, a laterally diffused metal oxide semiconductor (LDMOS) transistor, etc.

Further, while a case where the semiconductor devices according to the embodiments of the inventive concepts is a multi-channel transistor using a fin pattern has been described, the semiconductor devices according to the embodiments of the inventive concepts can also be planar transistors.

Figure 5:
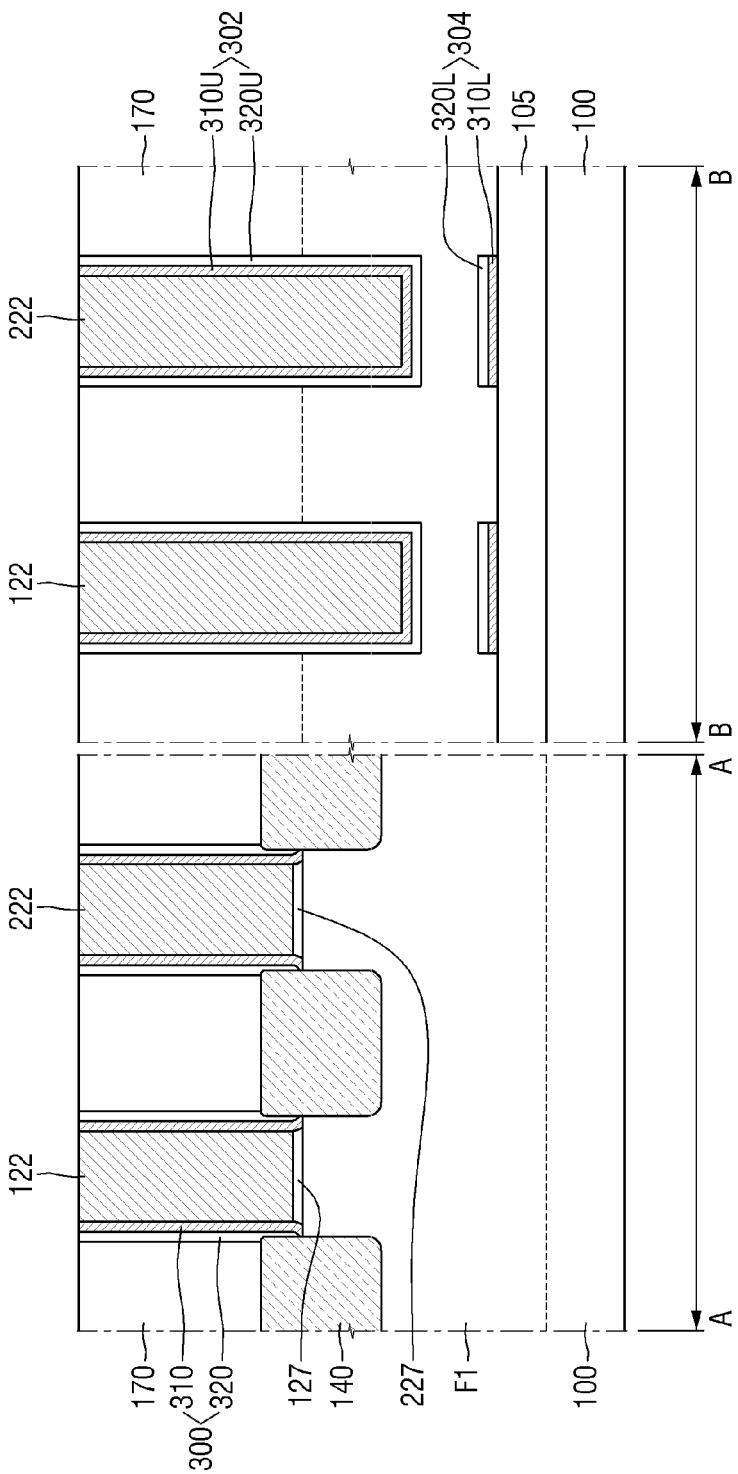
FIG. 5 illustrates a semiconductor device according to embodiments of the inventive concepts.
Figure 6:
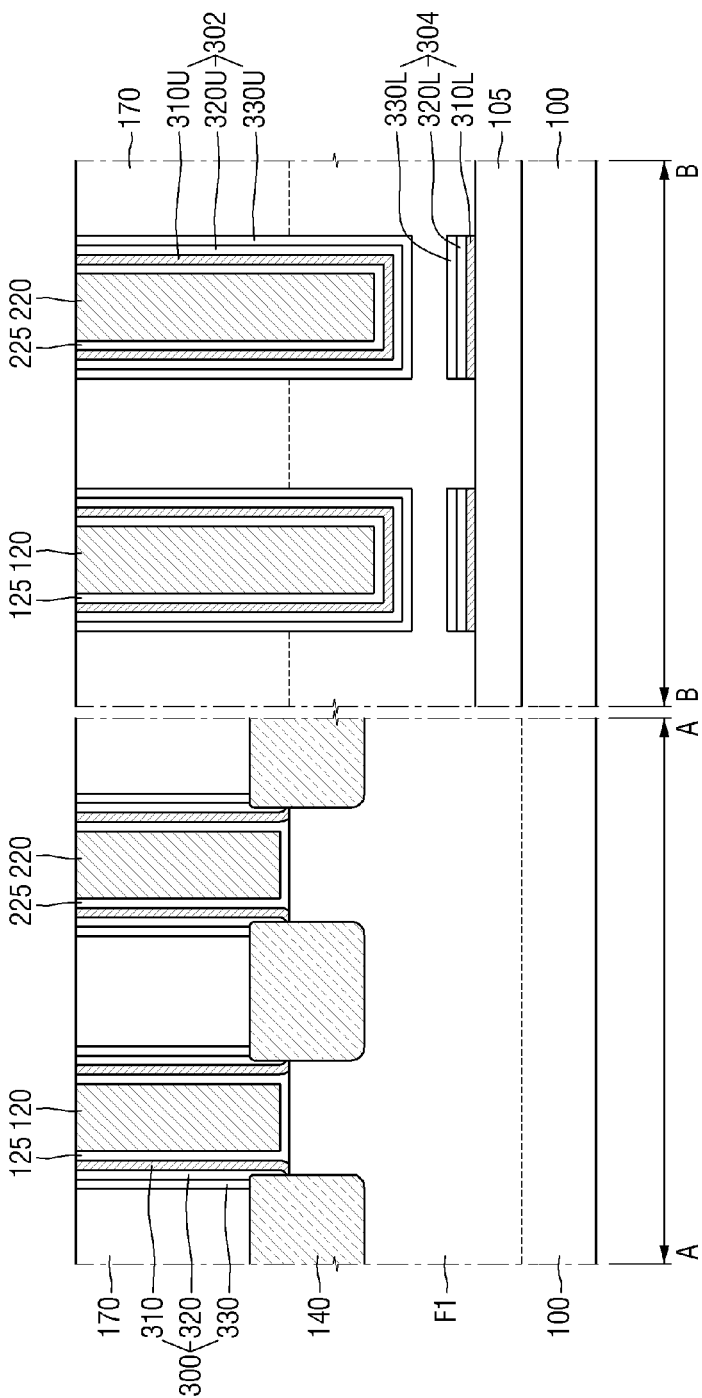
FIG. 6 illustrates a semiconductor device according to embodiments of the inventive concepts.

FIG. 5 illustrates a semiconductor device according to embodiments of the inventive concepts. FIG. 6 illustrates a semiconductor device according to embodiments of the inventive concepts. For ease of description, the following description will be made focusing mainly on differences with FIGS. 1 through 4B.

For reference, FIGS. 5 and 6 are cross-sectional views taken along the lines A-A and B-B of FIG. 1.

Referring to FIG. 5, in a semiconductor device according to the embodiments of the inventive concepts, a first gate insulating layer 127 may be formed between a first fin pattern F1 and a first gate electrode 122. In some embodiments, the first gate insulating layer 127 may be formed only on an upper surface of the first fin pattern F1 and may not be formed on sidewalls of a gate spacer 300.

Likewise, a second gate insulating layer 227 may be formed between the first fin pattern F1 and a second gate electrode 222. In some embodiments, the second gate insulating layer 227 may be formed only on the upper surface of the first fin pattern F1 and may not be formed on the sidewalls of the gate spacer 300.

In some embodiments, the first gate insulating layer 127 and the second gate insulating layer 227 may be formed before the process of forming a first spacer structure 302 and a second spacer structure 304 in a semiconductor fabrication process.

Referring to the A-A cross-section of FIG. 5, each of the first gate electrode 122 and the second gate electrode 222 may extend along the second direction Y and intersect the first fin pattern F1 and a second fin pattern F2. In some embodiments, the first gate electrode 122 may cover an upper surface of the first gate insulating layer 127 and the sidewalls of the gate spacer 300. Likewise, the second gate electrode 222 may cover an upper surface of the second gate insulating layer 227 and the sidewalls of the gate spacer 300.

Referring to the B-B cross-section of FIG. 5, a first spacer upper layer 310U of the first spacer structure 302 may surround each of the first gate electrode 122 and the second gate electrode 222. Specifically, the first spacer upper layer 310U may contact a lower surface and both sidewalls of each of the first gate electrode 122 and the second gate electrode 222.

A first gate structure (122 and 127) and a second gate structure (222 and 227) may be formed by, but are not limited to, a gate first process.

Referring to FIG. 6, in a semiconductor device according to the embodiments of the inventive concepts, a first spacer structure 302 may further include a third spacer upper layer 330U, and a second spacer structure 304 may further include a third spacer lower layer 330L. In some embodiments, gate spacer 300 may further include a third spacer layer 330.

Specifically, the third spacer upper layer 330U may be formed along an outer surface of a second spacer upper layer 320U. The third spacer lower layer 330L may be formed on an upper surface of a second spacer lower layer 320L. In some embodiments, the third spacer layer 330 may be formed along an outer surface of second spacer layer 320.

The third spacer upper layer 330U and the third spacer lower layer 330L may be formed in the same process. Therefore, the third spacer upper layer 330U and the third spacer lower layer 330L may have the same thickness and include the same material.

Figure 7:
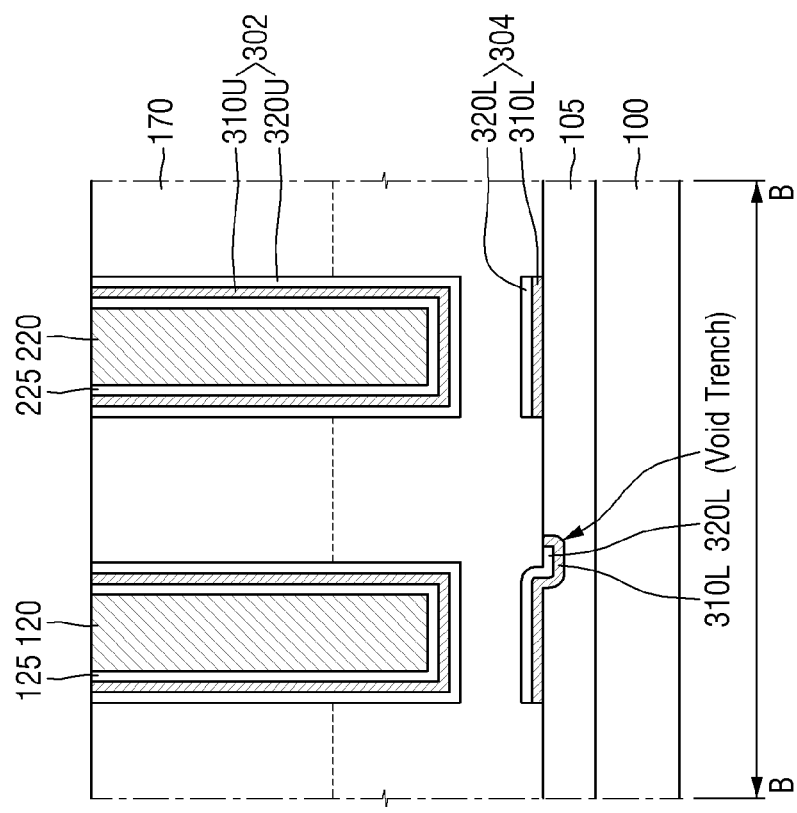
FIG. 7 illustrates a semiconductor device according to embodiments of the inventive concepts.

FIG. 7 illustrates a semiconductor device according to embodiments of the inventive concepts. For ease of description, the following description will be made focusing mainly on differences with FIGS. 1 through 4B. For reference, FIG. 7 is a cross-sectional view taken along the line B-B of FIG. 1.

Referring to FIG. 7, in semiconductor devices according to the embodiments of the inventive concepts, a field insulating layer 105 may include a single void or a plurality of voids. Here, the field insulating layer 105 may include a void trench which is cut concavely into the field insulating layer 105.

The void or voids may be formed in the process of forming the field insulating layer 105 and disposed at any position or positions within the field insulating layer 105. The void or voids can cause an unexpected short circuit between a gate electrode 120 and an epitaxial pattern during the operation of the semiconductor device. In this case, a defect may occur in the semiconductor device.

In semiconductor devices according to the embodiments of the inventive concepts, a part of a second spacer structure 304 may be formed along an inner surface of the void trench formed in the field insulating layer 105. That is, a part of the second spacer structure 304 may fill the void trench formed in the field insulating layer 105. Here, a first spacer lower layer 310L and a second spacer lower layer 320L included in the second spacer structure 304 may be formed conformally along the inner surface of the void trench.

The void trench filled with the second spacer structure 304 can reduce the likelihood of a short circuit between the gate electrode 120 and the epitaxial pattern 140 and increase the reliability, yield, and operation characteristics of the semiconductor device.

Figure 8:
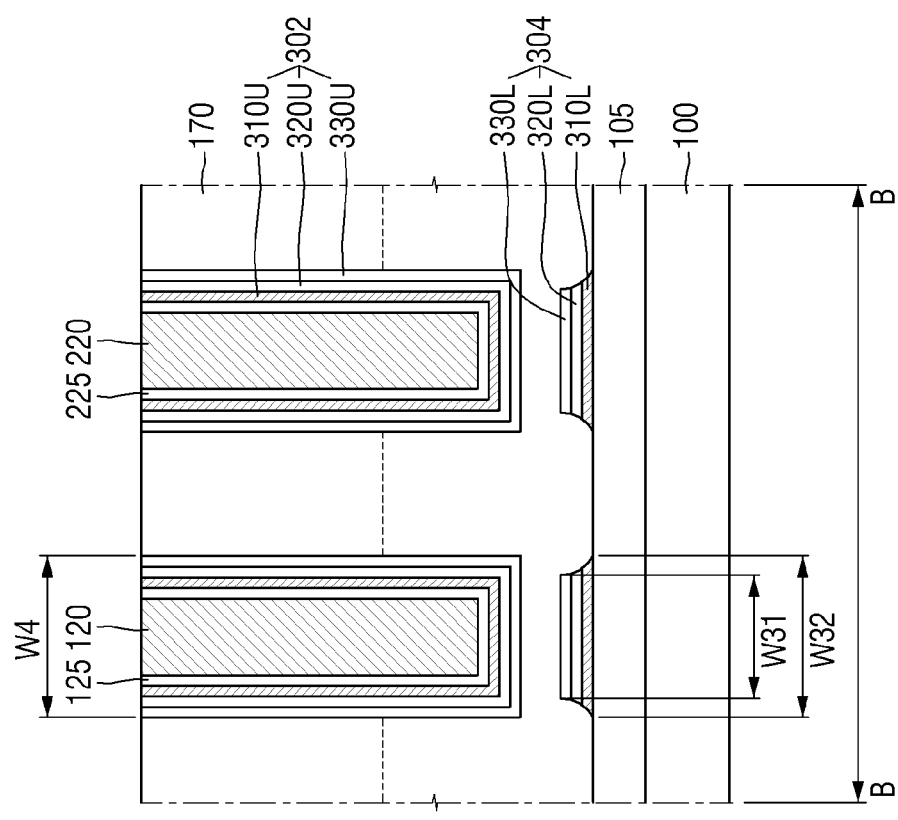
FIG. 8 illustrates a semiconductor device according to embodiments of the inventive concepts.

FIG. 8 illustrates a semiconductor device according to embodiments of the inventive concepts. For ease of description, the following description will be made focusing mainly on differences with FIG. 6. For reference, FIG. 8 is a cross-sectional view taken along the line B-B of FIG. 1.

Referring to FIG. 8, in semiconductor devices according to the embodiments of the inventive concepts, a width W4 of a lower surface of a first spacer structure 302 may be greater than a width W31 of an upper surface of a second spacer structure 304.

This characteristic may be generated in the process of anisotropically etching the second spacer structure 304 formed on a field insulating layer 105 which will be described herein. In the process of partially exposing the field insulating layer 105 by partially etching the second spacer structure 304 which covers the field insulating layer 105, an upper part of the second spacer structure 304 may be etched more than a lower part of the second spacer structure 304.

As a result of the above process, the second spacer structure 304 may be located under the first spacer structure 302, and the width W31 of the upper surface of the second spacer structure 304 may be smaller than a width W32 of a lower surface of the second spacer structure 304. However, the inventive concepts are not limited thereto.

Figure 9:
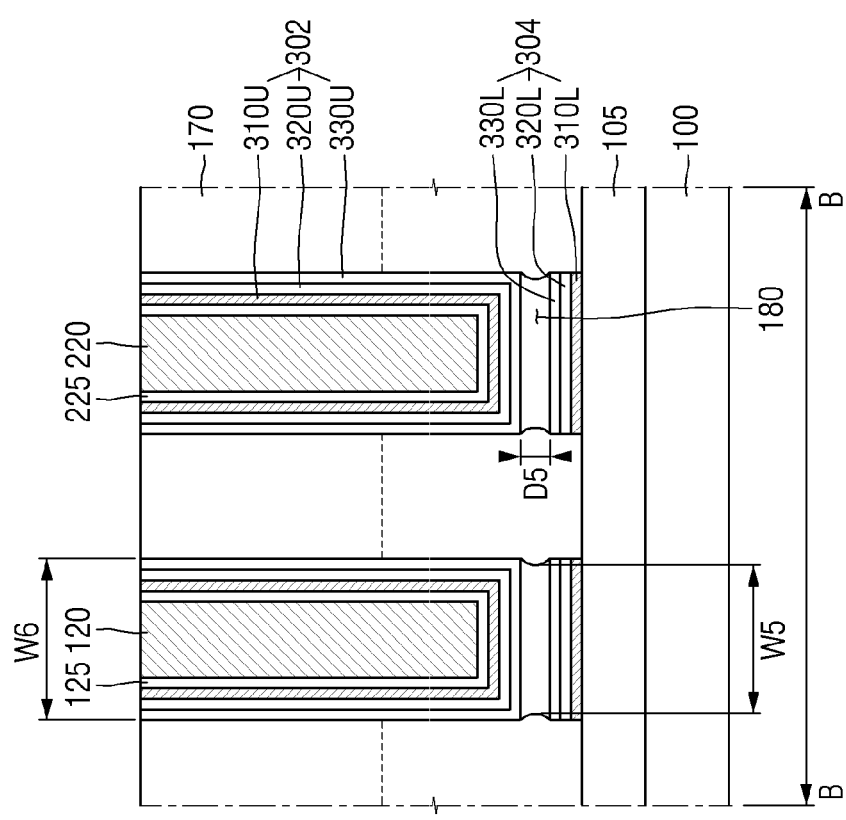
FIG. 9 illustrates a semiconductor device according to embodiments of the inventive concepts.
Figure 10:
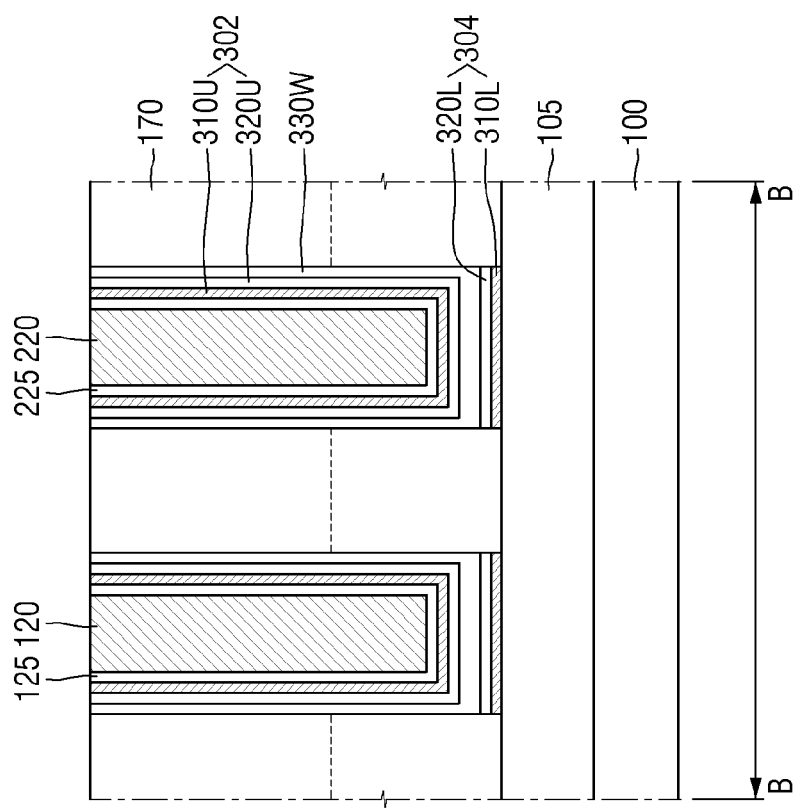
FIG. 10 illustrates a semiconductor device according to embodiments of the inventive concepts.

FIG. 9 illustrates a semiconductor device according to embodiments of the inventive concepts. FIG. 10 illustrates a semiconductor device according to embodiments of the inventive concepts. For case of description, the following description will be made focusing mainly on differences with FIGS. 1 through 4B. For reference, FIGS. 9 and 10 are cross-sectional views taken along the line B-B of FIG. 1.

Referring to FIG. 9, semiconductor devices according to the embodiments of the inventive concepts may further include an air gap 180 formed between a first spacer structure 302 and a second spacer structure 304.

The air gap 180 may be defined by an interlayer insulating film 170, the first spacer structure 302 and the second spacer structure 304. The interlayer insulating film 170 may not be formed within the air gap 180.

When a gap having a distance D5 between the first spacer structure 302 and the second spacer structure 304 is small, the interlayer insulating film 170 may not be formed in a space between the first spacer structure 302 and the second spacer structure 304 in the process of forming the interlayer insulating film 170. Therefore, the interlayer insulating film 170 may cover both sidewalls of each of the first spacer structure 302 and the second spacer structure 304 and may not completely cover a lower surface of the first spacer structure 302 and/or a lower structure of the second spacer structure 304.

Here, a width W5 of the air gap 180 in a direction parallel to the substrate 100 may be, but is not limited to, smaller than a width W6 of the first spacer structure 302.

Referring to FIG. 10, the semiconductor device according to the embodiments of the inventive concepts may further include a third spacer upper layer 330W which contacts an outer surface of a first spacer structure 302 and an upper surface of a second spacer structure 304. That is, the third spacer upper layer 330W may connect the first spacer structure 302 and the second spacer structure 304.

A space between the first spacer structure 302 and the second spacer structure 304 may be filled with the third spacer upper layer 330W.

Sidewalls of the third spacer upper layer 330W may be collinear with sidewalls of the second spacer structure 304, but the inventive concepts are not limited thereto.

Figure 11:
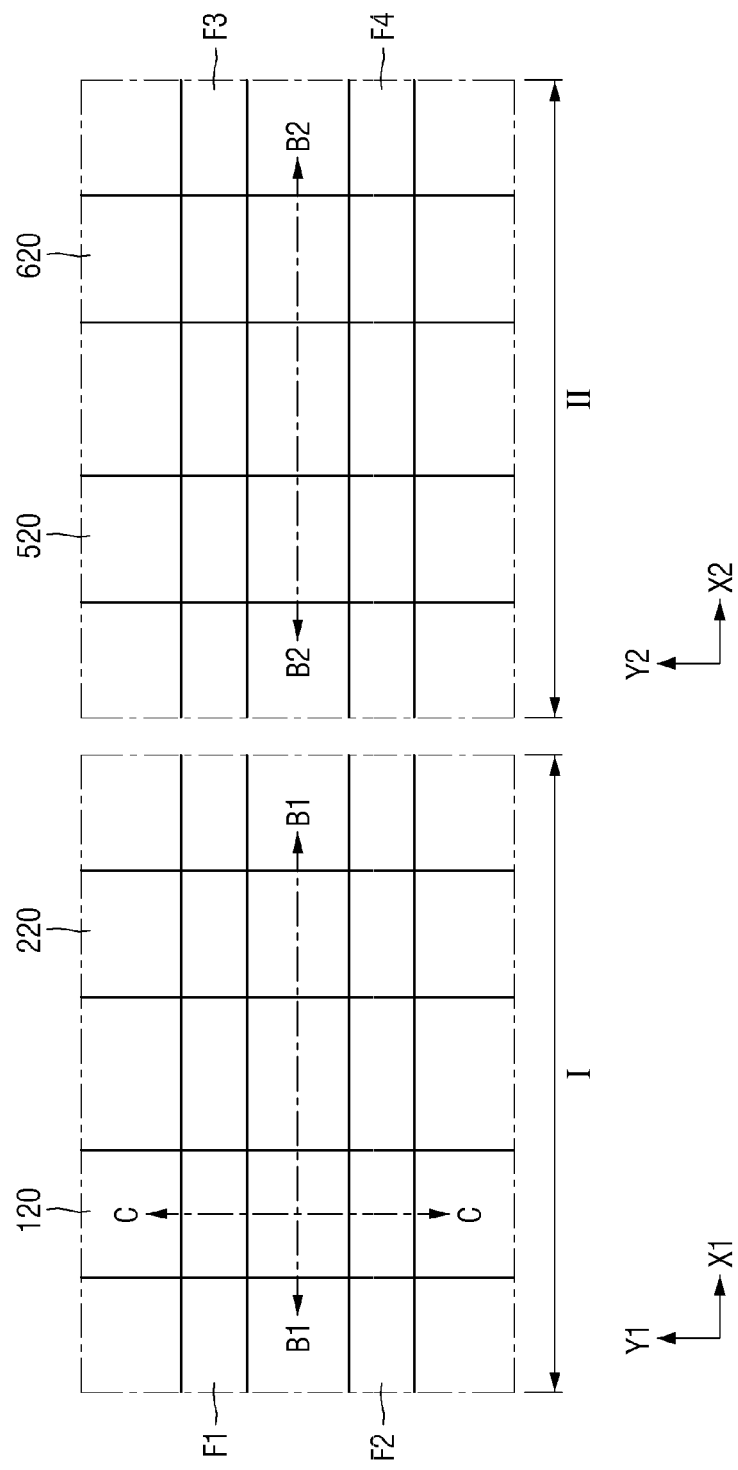
FIG. 11 is a layout view of a semiconductor device according to embodiments of the inventive concepts.
Figure 12:
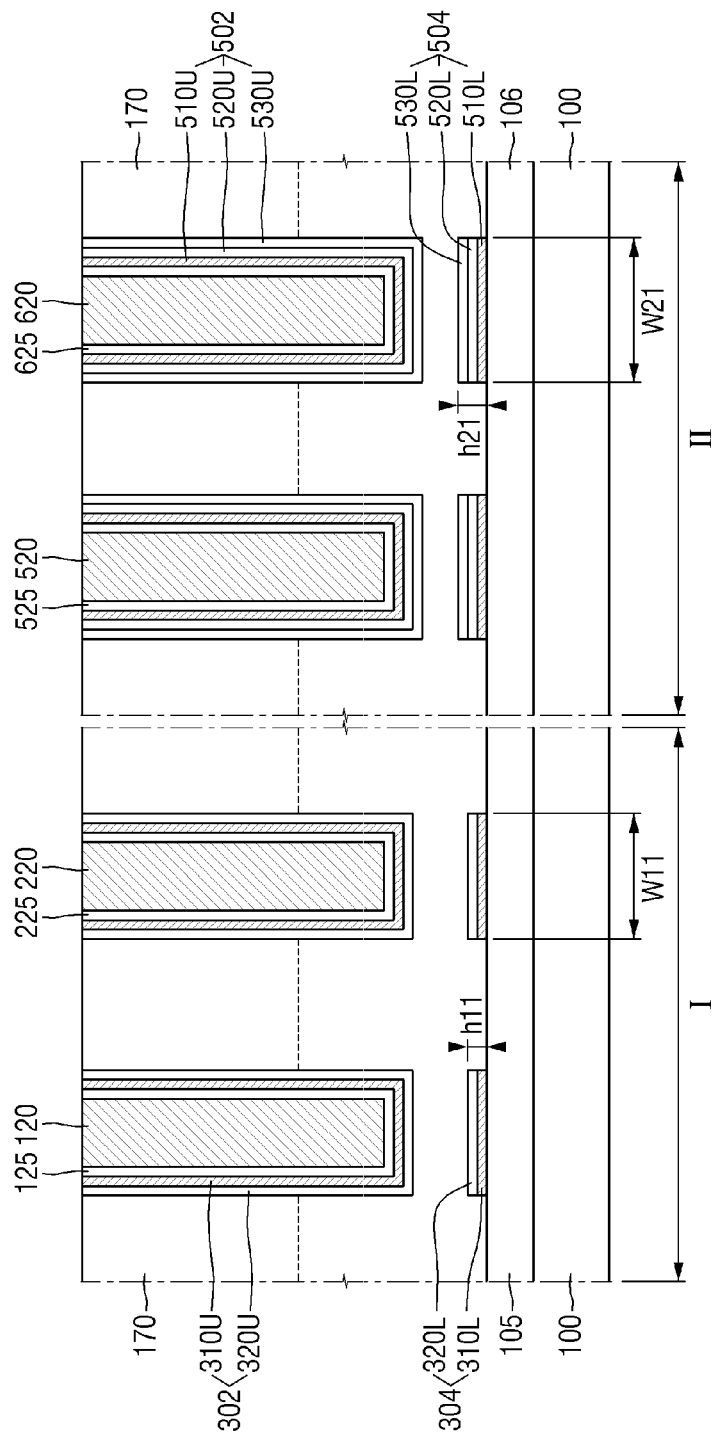
FIG. 12 illustrates cross-sectional views taken along the lines B1-B1 and B2-B2 of FIG. 11.

FIG. 11 is a layout view of a semiconductor device according to embodiments of the inventive concepts. FIG. 12 illustrates cross-sectional views taken along the lines B1-B1 and B2-B2 of FIG. 11.

A substrate 100 may include a first area I and a second area II. The first area I and the second area II may be separated from each other or connected to each other.

A first fin pattern F1 and a second fin pattern F2 may be formed on the first area I of the substrate 100 to be adjacent to each other. The first fin pattern F1 and the second fin pattern F2 may extend along a first direction X1.

A field insulating layer 105 may be formed on the first area I of the substrate 100. The field insulating layer 105 may be formed between the first fin pattern F1 and the second fin pattern F2. The field insulating layer 105 may cover part of the first fin pattern F1 and part of the second fin pattern F2.

A first gate structure (120 and 125) may include a first gate electrode 120 and a first gate insulating layer 125, and a second gate structure (220 and 225) may include a second gate electrode 220 and a second gate insulating layer 225.

Each of the first gate electrode 120 and the second gate electrode 220 may extend along a second direction Y1. Each of the first gate electrode 120 and the second gate electrode 220 may intersect the first fin pattern F1 and the second fin pattern F2. The first gate electrode 120 and the second gate electrode 220 may be adjacent to each other.

The first gate insulating layer 125 may cover sidewalls and a lower surface of the first gate electrode 120. The second gate insulating layer 225 may cover sidewalls and a lower surface of the second gate electrode 220.

In the first area I, a first spacer structure 302 may cover sidewalls and a lower surface of the first gate structure (120 and 125) and/or the second gate structure (220 and 225). A second spacer structure 304 may be formed under the first spacer structure 302 and the first gate structure (120 and 125), and/or under the first spacer structure 302 and the second gate structure (220 and 225). The second spacer structure 304 may be formed on a part of an upper surface of the field insulating layer 105 which is overlapped by the first gate structure (120 and 125) and/or the second gate structure (220 and 225).

Likewise, a third fin pattern F3 and a fourth fin pattern F4 may be formed on the second area II of the substrate 100 to be adjacent to each other. The third fin pattern F3 and the fourth fin pattern F4 may extend along a third direction X2.

A field insulating layer 106 may be formed on the second area II of the substrate 100. The field insulating layer 106 may be formed between the third fin pattern F3 and the fourth fin pattern F4. The field insulating layer 106 may cover part of the third fin pattern F3 and part of the fourth fin pattern F4.

A third gate structure (520 and 525) may include a third gate electrode 520 and a third gate insulating layer 525, and a fourth gate structure (620 and 625) may include a second gate electrode 620 and a second gate insulating layer 625.

Each of the third gate electrode 520 and the fourth gate electrode 620 may extend along a fourth direction Y2. Each of the third gate electrode 520 and the fourth gate electrode 620 may intersect the third fin pattern F3 and the fourth fin pattern F4. The third gate electrode 520 and the fourth gate electrode 620 may be adjacent to each other.

The third gate insulating layer 525 may cover sidewalls and a bottom surface of the third gate electrode 520. The fourth gate insulating layer 625 may cover sidewalls and a lower surface of the fourth gate electrode 620.

In the second area II, a third spacer structure 502 may cover sidewalls and a lower surface of the third gate structure (520 and 525) and/or the fourth gate structure (620 and 625). A fourth spacer structure 504 may be formed under the third spacer structure 502 and the third gate structure (520 and 525), and/or under the third spacer structure 502 and the fourth gate structure (620 and 625). The fourth spacer structure 504 may be formed on a part of an upper surface of the field insulating layer 106 which is overlapped by the third gate structure (520 and 525) or the fourth gate structure (620 and 625).

Here, the first spacer structure 302 and the third spacer structure 502 may have different thicknesses. In addition, the second spacer structure 304 and the fourth spacer structure 504 may have different thicknesses.

Specifically, the first spacer structure 302 may include a first spacer upper layer 310U and a second spacer upper layer 320U. The second spacer structure 304 may include a first spacer lower layer 310L and a second spacer lower layer 320L.

The first spacer upper layer 310U and the second spacer upper layer 320U may include different materials. The first spacer upper layer 310U may contact the first gate structure (120 and 125) and/or the second gate structure (220 and 225), and the second spacer upper layer 320U may be formed along an outer surface of the first spacer upper layer 310U.

The first spacer lower layer 310L may contact the upper surface of the field insulating layer 105, and the second spacer lower layer 320L may be formed along an upper surface of the first spacer lower layer 310L.

The first spacer lower layer 310L may include the same material as the first spacer upper layer 310U and may be formed by the same process as the first spacer upper layer 310U. Likewise, the second spacer lower layer 320L may include the same material as the second spacer upper layer 320U and may be formed by the same process as the second spacer upper layer 320U.

The third spacer structure 502 may include a third spacer upper layer 510U, a fourth spacer upper layer 520U and a fifth spacer upper layer 530U. The fourth spacer structure 504 may include a third spacer lower layer 510L, a fourth spacer lower layer 520L and a fifth spacer lower layer 530L.

The third, fourth and fifth spacer upper layers 510U, 520U and 530U may include different materials. Specifically, the third spacer upper layer 510U may include the same material as the first spacer upper layer 310U and may be formed by the same process as the first spacer upper layer 310U. The fourth spacer upper layer 520U may include the same material as the second spacer upper layer 320U and may be formed by the same process as the second spacer upper layer 320U. However, the fifth spacer upper layer 530U may include a different material from the third spacer upper layer 510U and the fourth spacer upper layer 520U.

The third spacer upper layer 510U may contact the third gate structure (520 and 525) and/or the fourth gate structure (620 and 625), and the fourth spacer upper layer 520U may be formed along an outer surface of the third spacer upper layer 510U. The fifth spacer upper layer 530U may be formed along an outer surface of the fourth spacer upper layer 520U.

Likewise, the third, fourth and fifth spacer lower layers 510L, 520L and 530L may include different materials. Specifically, the third spacer lower layer 510L may include the same material as the third spacer upper layer 510U and may be formed by the same process as the third spacer upper layer 510U. The fourth spacer lower layer 520L may include the same material as the fourth spacer upper layer 520U and may be formed by the same process as the fourth spacer upper layer 520U. The fifth spacer lower layer 530L may include the same material as the fifth spacer upper layer 530U and may be formed by the same process as the fifth spacer upper layer 530U.

The third spacer lower layer 510L may contact the upper surface of the field insulating layer 106, and the fourth spacer lower layer 520L may be formed along an upper surface of the third spacer lower layer 510L. The fifth spacer lower layer 530L may be formed along an upper surface of the fourth spacer lower layer 520L.

Therefore, a thickness h11 of the second spacer structure 304 may be smaller than a thickness h21 of the fourth spacer structure 504. A width W11 of the second spacer structure 304 may be smaller than a width W21 of the fourth spacer structure 504.

An interlayer insulating film 170 may be formed on the field insulating layer 105. The interlayer insulating film 170 may cover an outer surface of the first spacer structure 302, an outer surface of the second spacer structure 304, an outer surface of the third spacer structure 502, and an outer surface of the fourth spacer structure 504.

Figure 13:
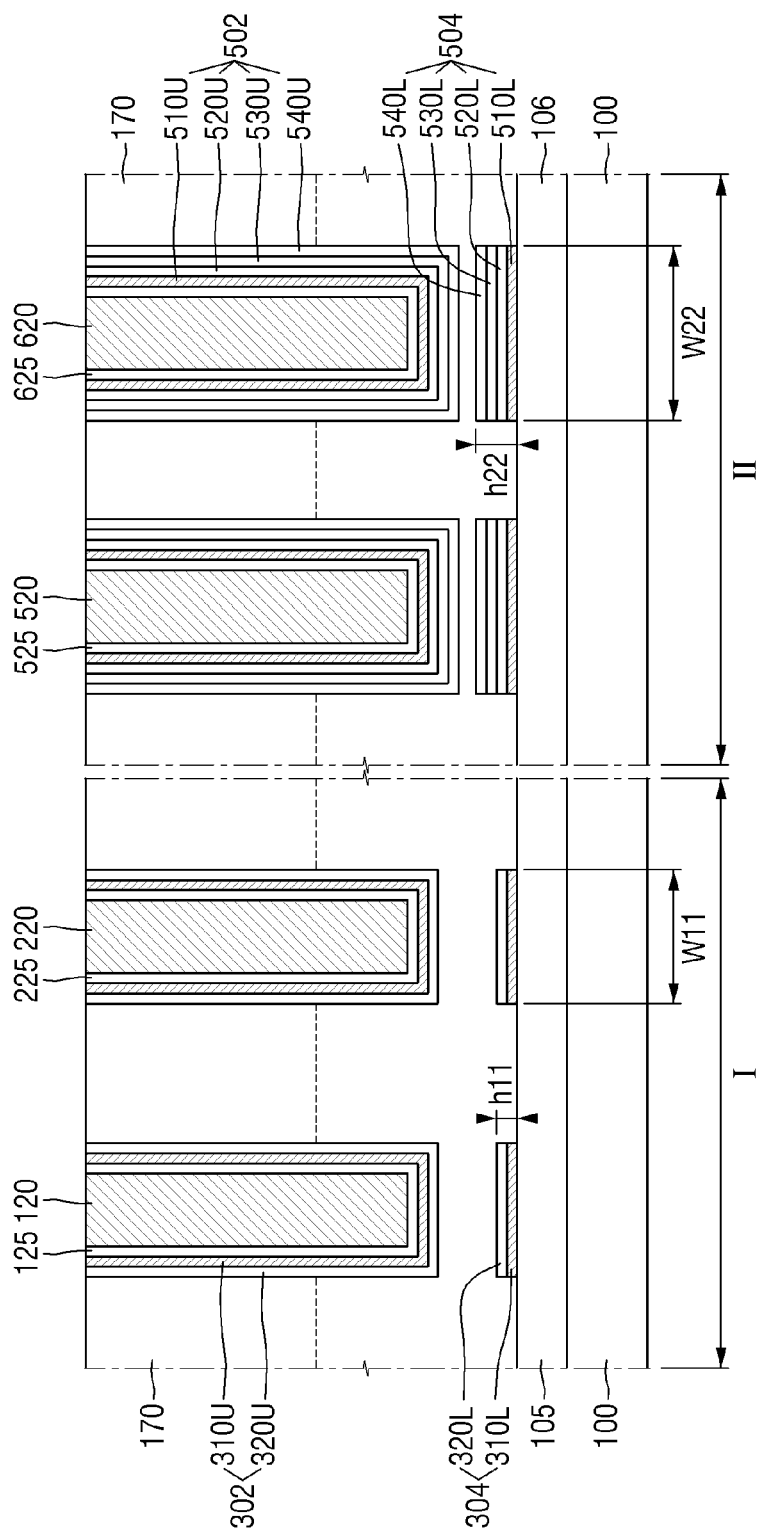
FIG. 13 illustrates a semiconductor device according to embodiments of the inventive concepts.
Figure 14:
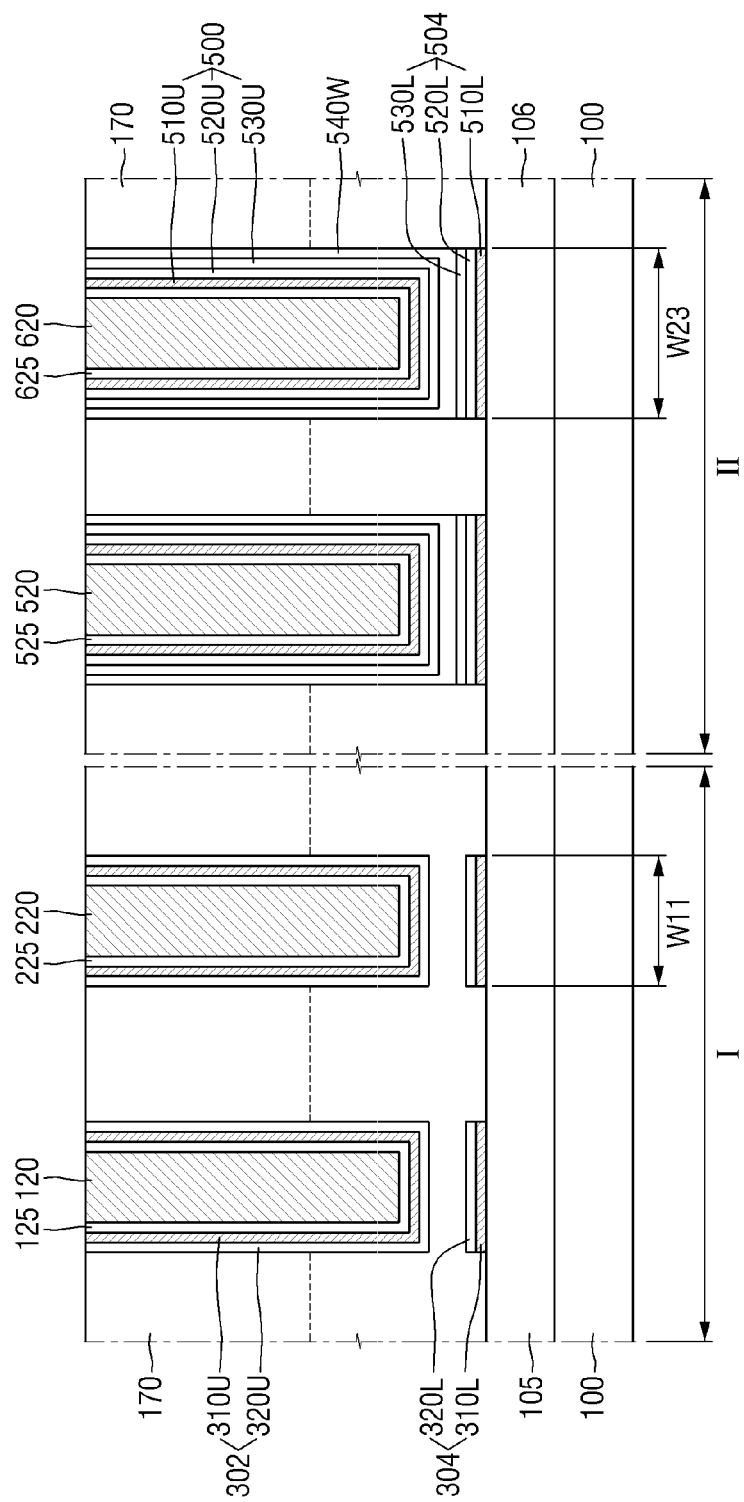
FIG. 14 illustrates a semiconductor device according to embodiments of the inventive concepts.

FIG. 13 illustrates a semiconductor device according to embodiments of the inventive concepts. FIG. 14 illustrates a semiconductor device according to embodiments of the inventive concepts. For ease of description, the following description will be made focusing mainly on differences with FIGS. 11 and 12. For reference, FIGS. 13 and 14 are cross-sectional views taken along the lines B1-B1 and B2-B2 of FIG. 11.

Referring to FIG. 13, in semiconductor devices according to the embodiments of the inventive concepts, a third spacer structure 502 may further include a sixth spacer upper layer 540U, and a fourth spacer structure 504 may further include a sixth spacer lower layer 540L.

Specifically, the sixth spacer upper layer 540U may be formed along an outer surface of a fifth spacer upper layer 530U. The sixth spacer lower layer 540L may be formed on an upper surface of a fifth spacer lower layer 530L.

The sixth spacer upper layer 540U and the sixth spacer lower layer 540L may be formed in the same process. Therefore, the sixth spacer upper layer 540U and the sixth spacer lower layer 540L may have the same thickness and include the same material.

Therefore, a thickness h22 of the fourth spacer structure 504 may be greater than the thickness h21 of the fourth spacer structure 504 of the semiconductor device described above with reference to FIG. 12. A width W22 of the fourth spacer structure 504 may be greater than the width W21 of the fourth spacer structure 504 of the semiconductor device described above with reference to FIG. 12.

Referring to FIG. 14, the semiconductor device according to the embodiments of the inventive concepts may further include a sixth spacer upper layer 540W which contacts an outer surface of a third spacer structure 502 and an upper surface of a fourth spacer structure 504. That is, the sixth spacer upper layer 540W may connect the third spacer structure 502 and the fourth spacer structure 504.

A space between the third spacer structure 502 and the fourth spacer structure 504 may be filled with the sixth spacer upper layer 540W. A width W23 of the fourth spacer structure 504 may be greater than a width W11 of a second spacer structure 304.

Sidewalls of the sixth spacer upper layer 540W may be collinear with sidewalls of the fourth spacer structure 504, but the inventive concepts are not limited thereto.

FIGS. 15 through 23 are views illustrating operations of methods of fabricating semiconductor devices according to embodiments of the inventive concepts. For ease of description, the following description will be made focusing mainly on differences with FIGS. 1 through 14.

For reference, FIGS. 15 through 23 are cross-sectional views taken along the lines A-A and B-B of FIG. 1.

Figure 15:
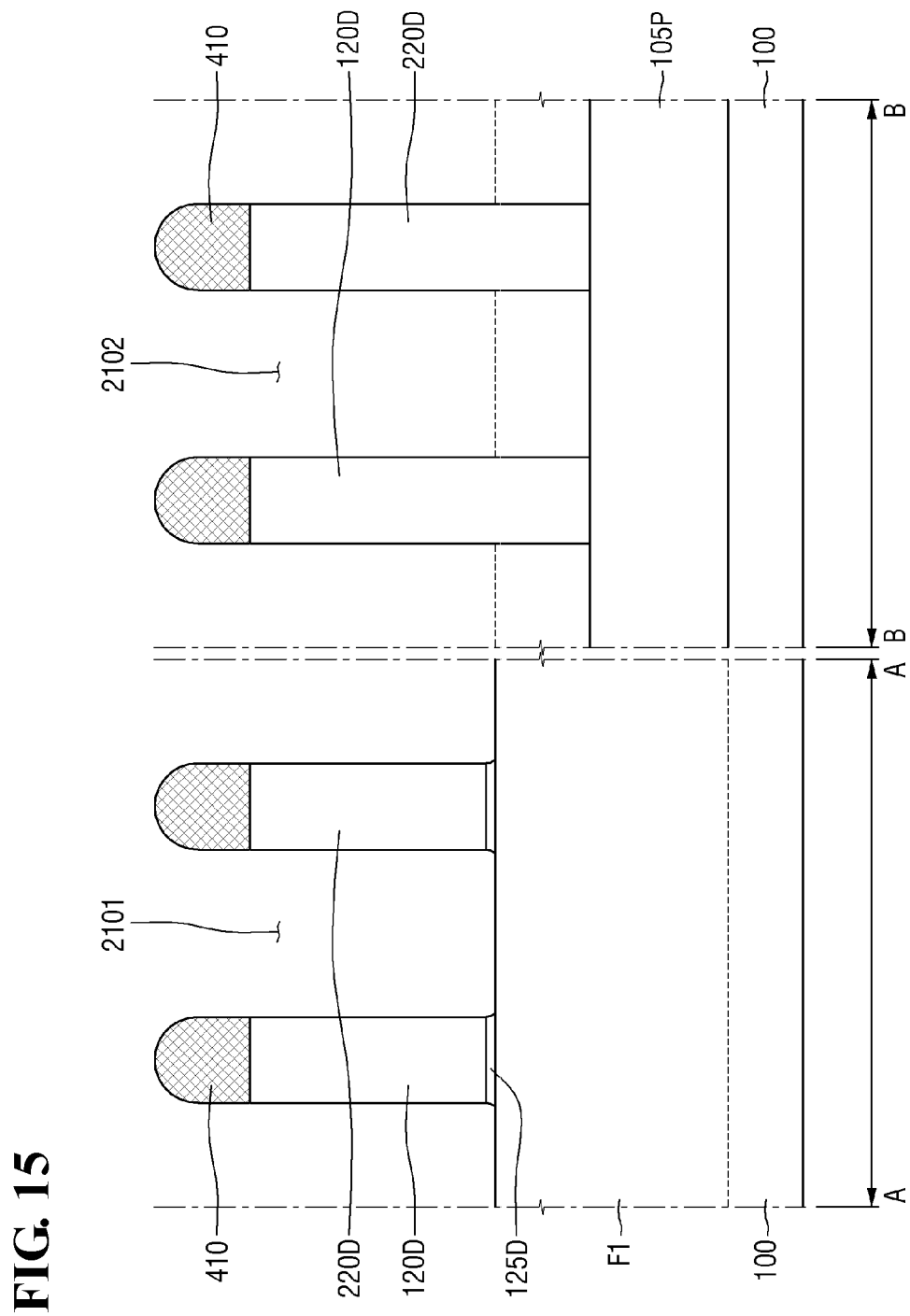
FIGS. 15 through 23 are views illustrating operations of methods of fabricating semiconductor devices according to embodiments of the inventive concepts.

Referring to FIG. 15, in a method of fabricating semiconductor devices according to the embodiments of the inventive concepts, dummy gate electrodes 120D and 220D and a dummy gate insulating layer 125D which are not covered by hard mask patterns 410 may be etched, thereby forming a first trench 2101 and a second trench 2102.

Here, the dummy gate insulating layer 125D may not be formed between the dummy gate electrodes 120D and 220D and a field insulating layer 105P.

Figure 16:
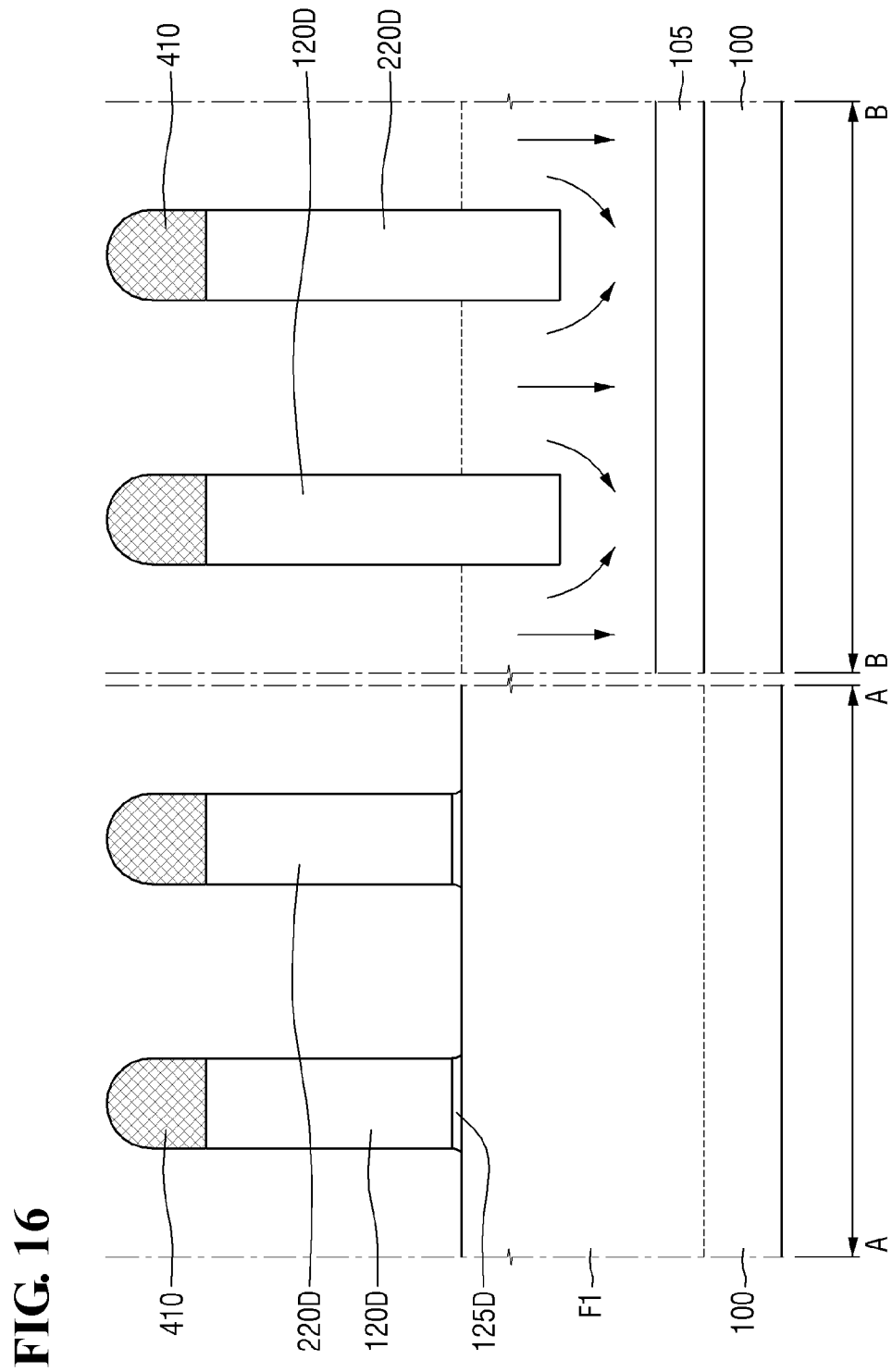

Referring to FIG. 16, the field insulating layer 105 may be etched using isotropic etching. The process of etching the field insulating layer 105 may be a dry etching process or a wet etching process. In the isotropic etching process, the field insulating layer 105 existing on a lower side of each of the dummy gate electrodes 120D and 220D may be etched. Accordingly, the dummy gate electrodes 120D and 220D may be separated from the field insulating layer 105.

Figure 17:
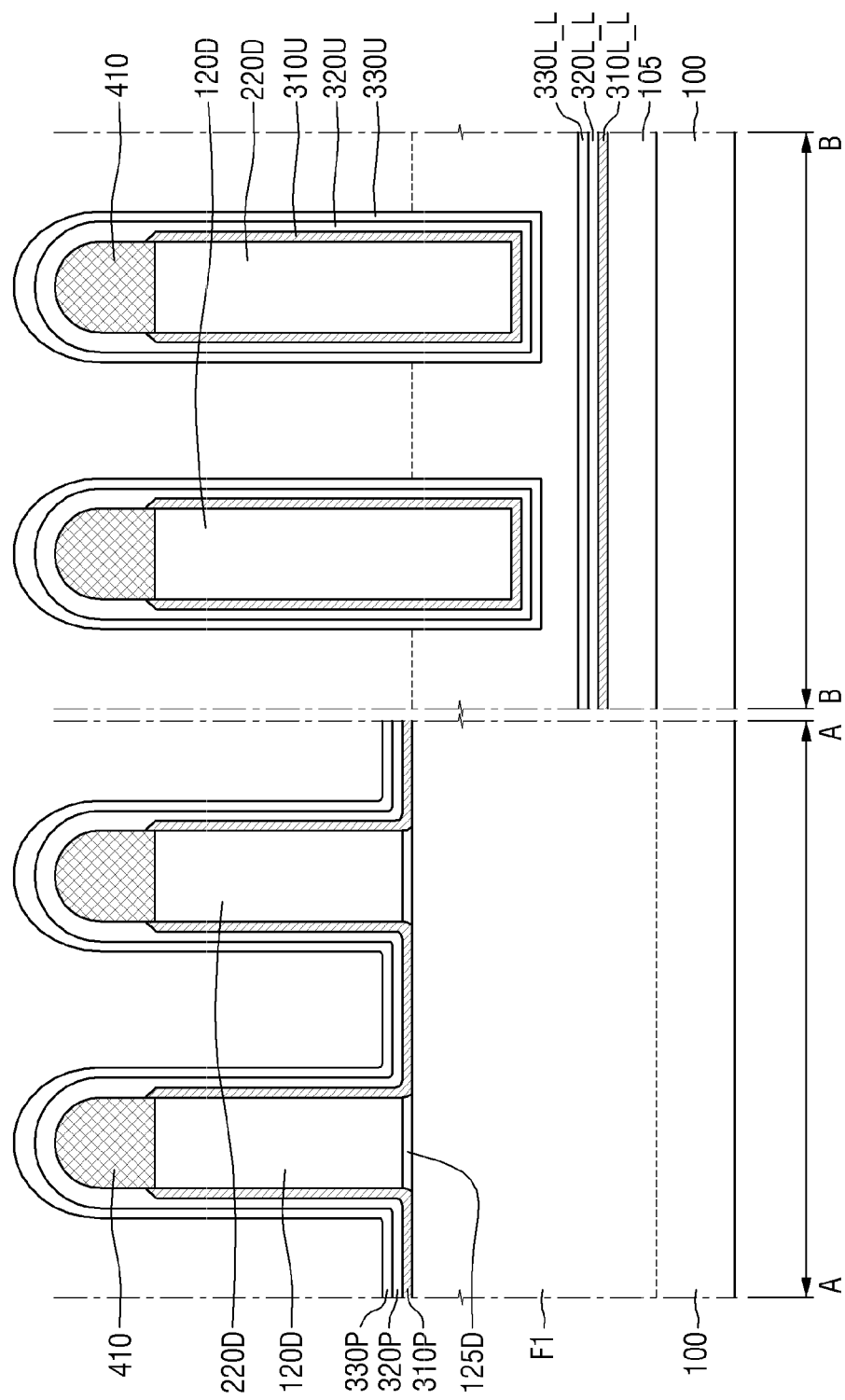

Referring to FIG. 17, first through third gate spacer layers 310P, 320P, 330P which cover sidewalls of the dummy gate electrodes 120D and 220D and a first fin pattern F1, first through third spacer upper layers 310U, 320U, 330U which cover outer surfaces of the dummy gate electrodes 120D and 220D, and first through third spacer lower layers 310L_L, 320L_L, 330L_L which cover the field insulating layer 105 may be formed.

Here, the first gate spacer layer 310P, the first spacer upper layer 310U and the first spacer lower layer 310L_L may be formed in the same process. The first gate spacer layer 310P may be formed to contact the sidewalls of each of the dummy gate electrodes 120D and 220D, and the first spacer upper layer 310U may be formed to contact the sidewalls and a lower surface of each of the dummy gate electrodes 120D and 220D.

Likewise, the second gate spacer layer 320P, the second spacer upper layer 320U and the second spacer lower layer 320L_L may be formed a the same process. The third gate spacer layer 330P, the third spacer upper layer 330U, and the third spacer lower layer 330L_L may also be formed in a same process.

Figure 18:
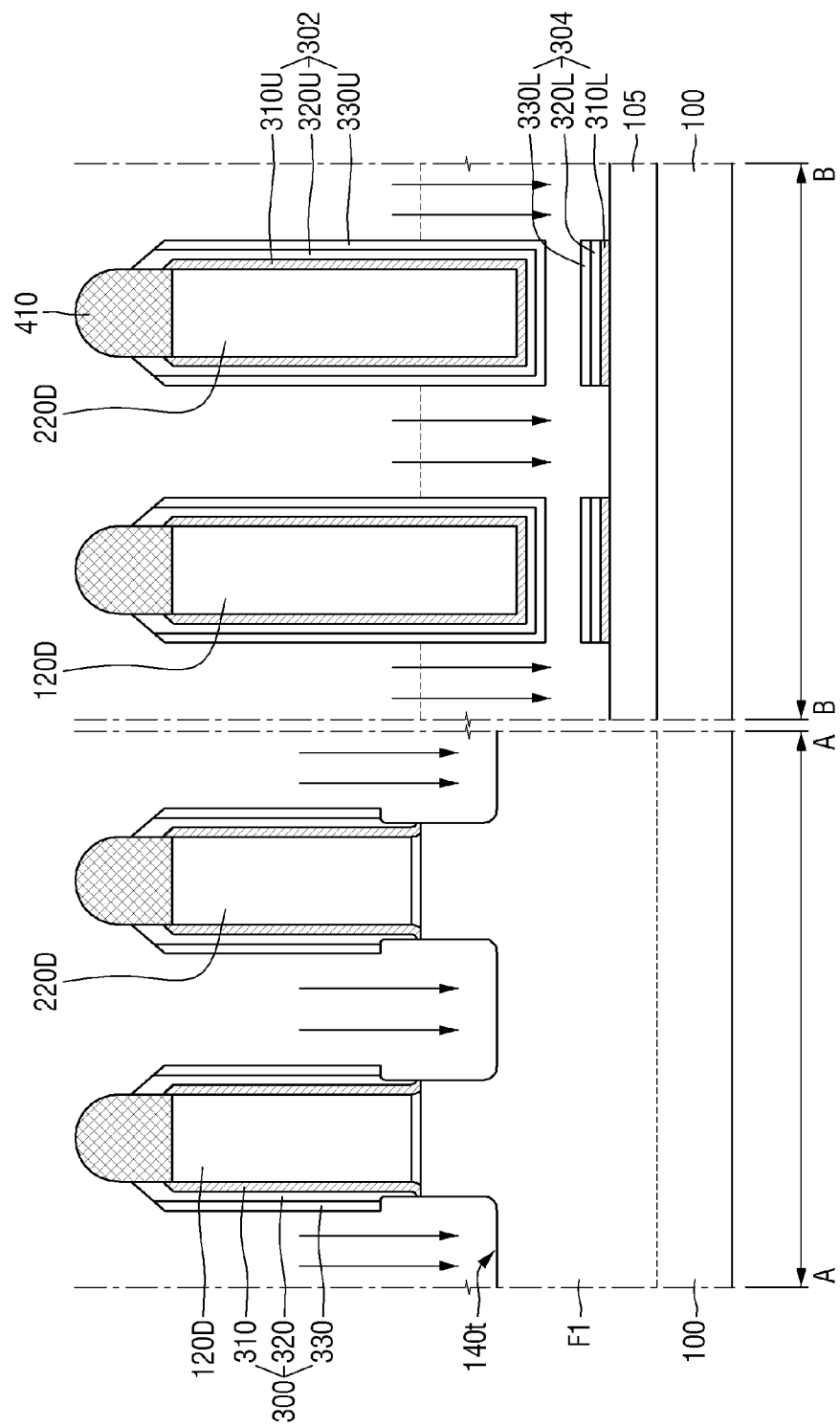

Referring to FIG. 18, an epitaxial pattern trench 140t is formed on both sides of each of the dummy gate electrodes 120D and 220D using an anisotropic etching process. In this process, the first through third gate spacer layers 310P, 320P, 330P disposed on both sides of each of the dummy gate electrodes 120D and 220D may be etched, resulting in the formation of a gate spacer 300 including first through third spacer layers 310, 320, 330.

Likewise, in the above anisotropic etching process, the hard mask patterns 410 may be partially exposed, and the first through third spacer lower layers 310L_L, 320L_L, 330L_L may be etched excluding respective portions disposed under the first through third spacer upper layers 310U, 320U, 330U. Accordingly, at least part of the field insulating layer 105 may be exposed. In the above process, a second spacer structure 304 may be formed including first through third spacer lower layers 310L, 320L, 330L.

Figure 19:
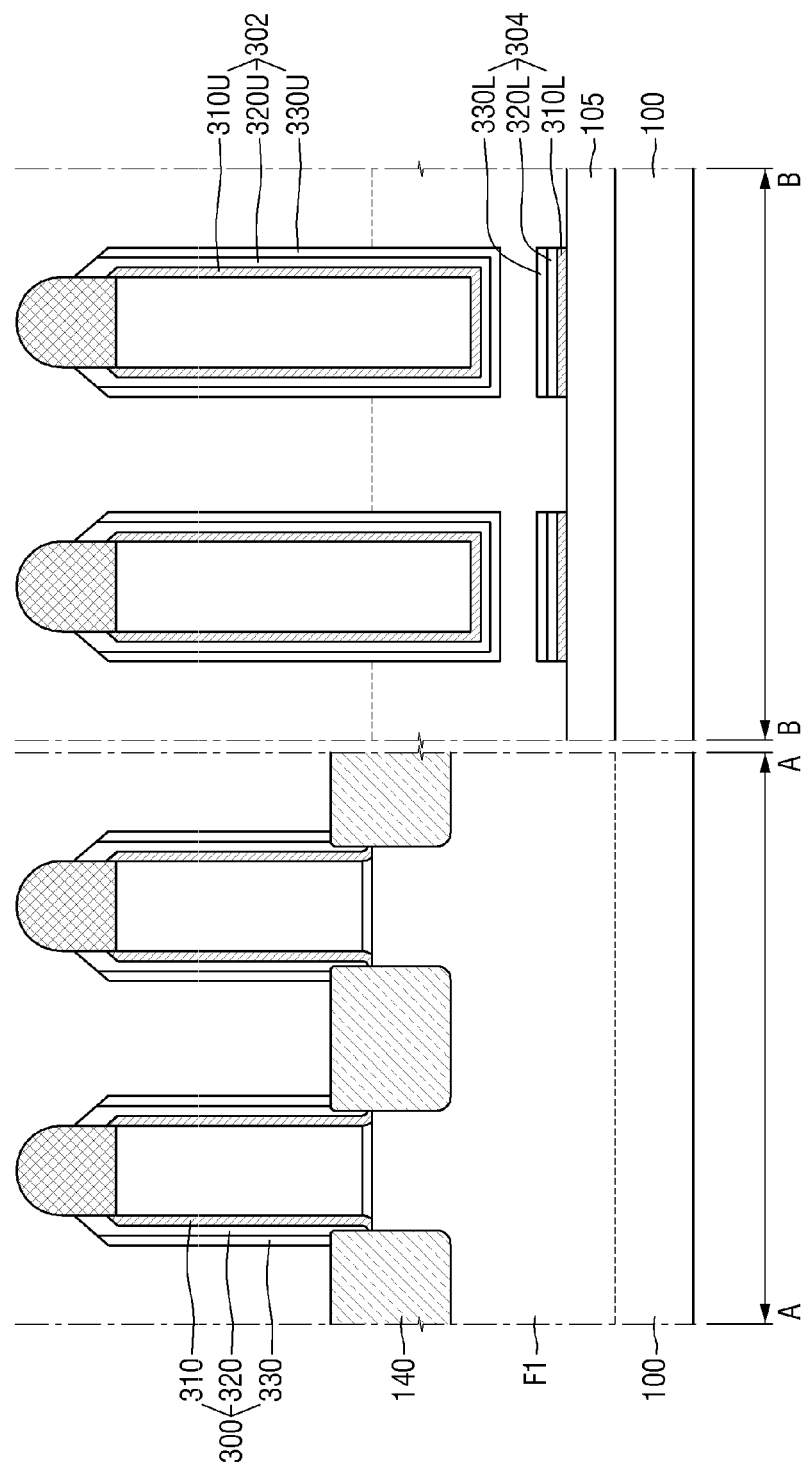

Referring to FIG. 19, an epitaxial pattern 140 may be grown in each epitaxial pattern trench 140t using an epitaxial growth process. The epitaxial pattern 140 may operate as a source/drain region. A method of growing the epitaxial pattern 140 on the first fin pattern F1 may be any one of solid phase epitaxy (SPE), liquid phase epitaxy (LPE), and vapor phase epitaxy (VPE).

Figure 20:
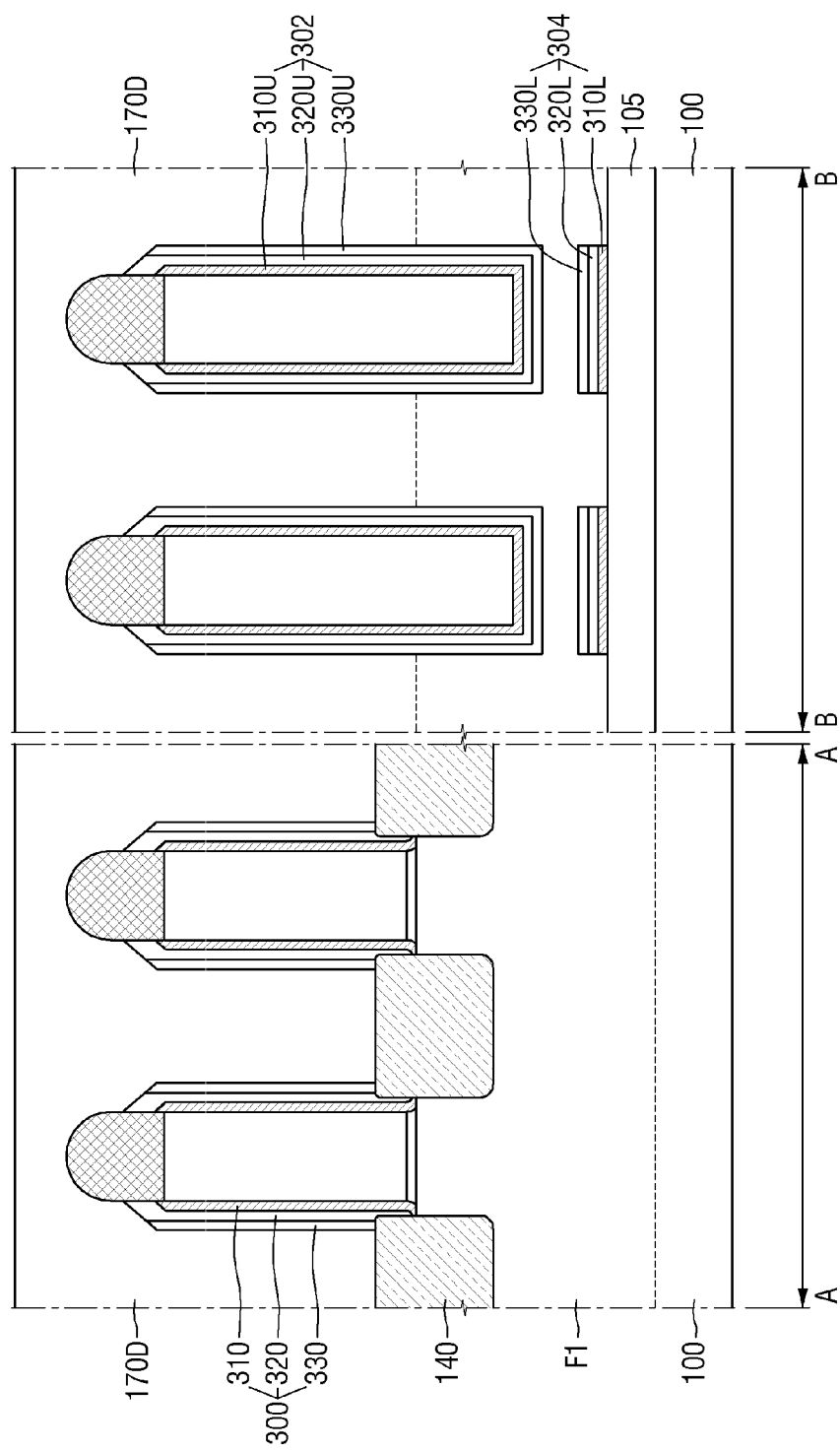

Referring to FIG. 20, an interlayer insulating film 170D may be formed to cover the epitaxial pattern 140, the gate spacer 300, a first spacer structure 302, the second spacer structure 304, and the field insulating layer 105.

Here, the interlayer insulating film 170D may fill a space between the first spacer structure 302 and the second spacer structure 304.

Figure 21:
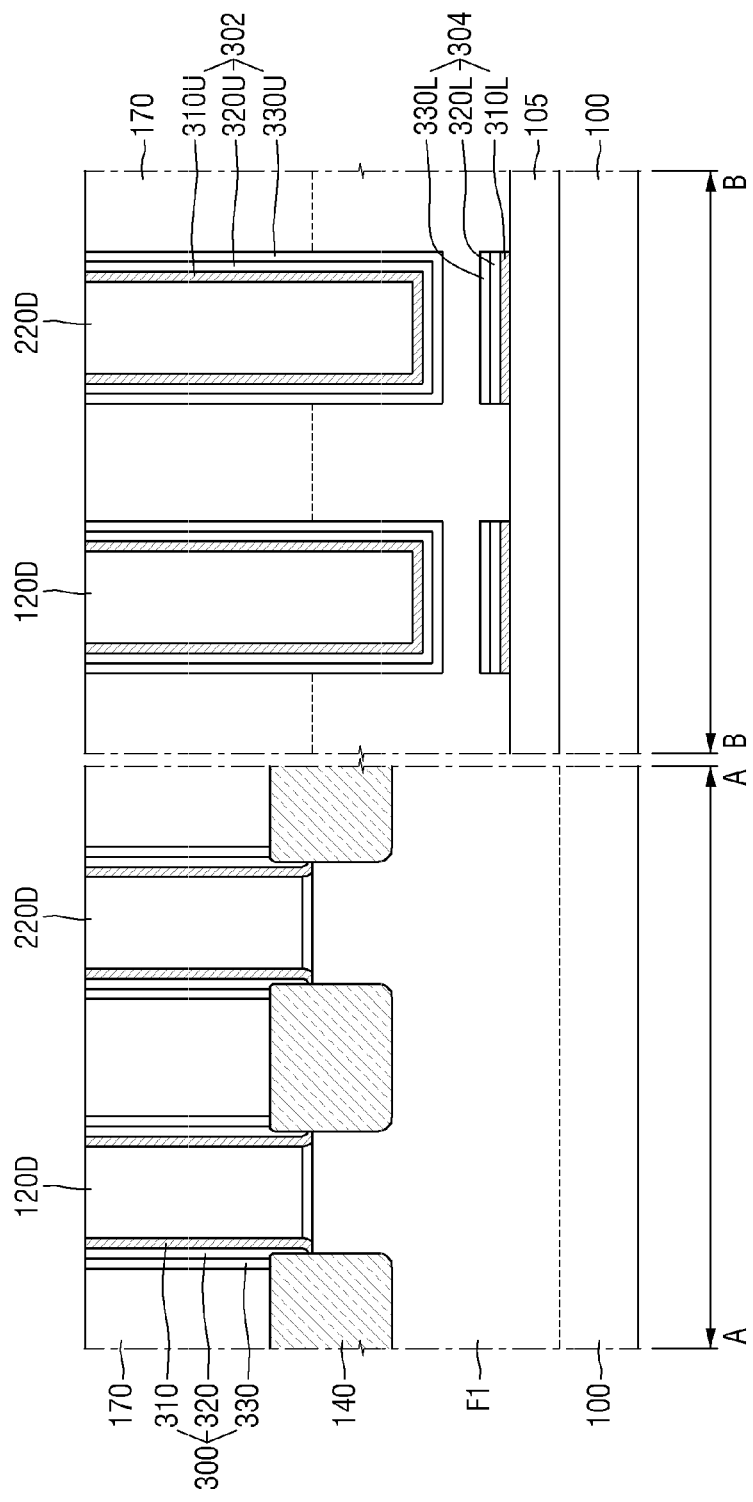

Referring to FIG. 21, a planarization process (e.g., a chemical mechanical polishing (CMP) process) may be performed to make an upper surface of the interlayer insulating film 170 and upper surfaces of the dummy gate electrodes 120D and 220D lie in the same plane. Accordingly, an upper surface of the gate spacer 300 and an upper surface of the first spacer structure 302 may also be located in the same plane.

Figure 22:
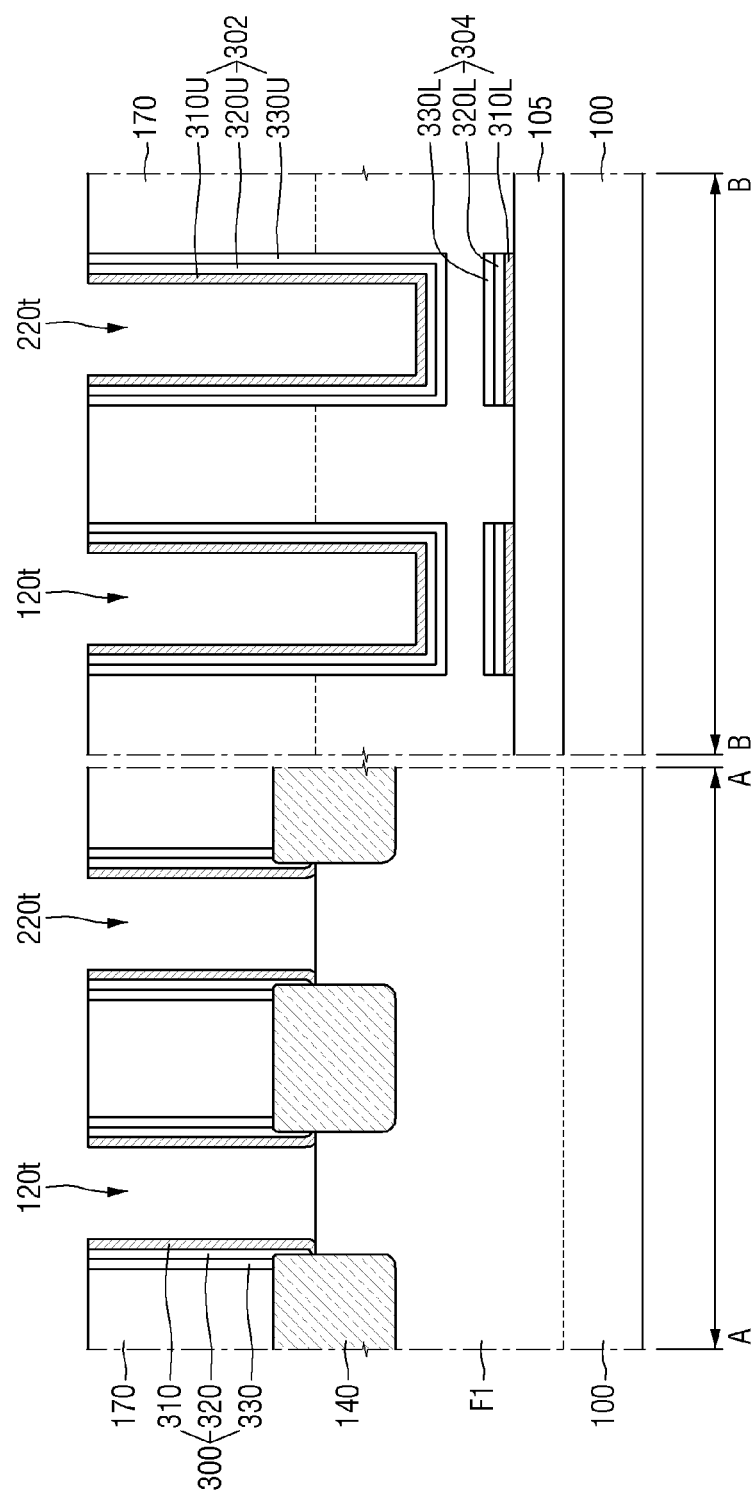

Referring to FIG. 22, the dummy gate electrodes 120D and 220D and the dummy gate insulating layer 125D may be removed to form a first trench 120t and a second trench 220t in the gate spacer 300 and the first spacer structure 302.

Figure 23:
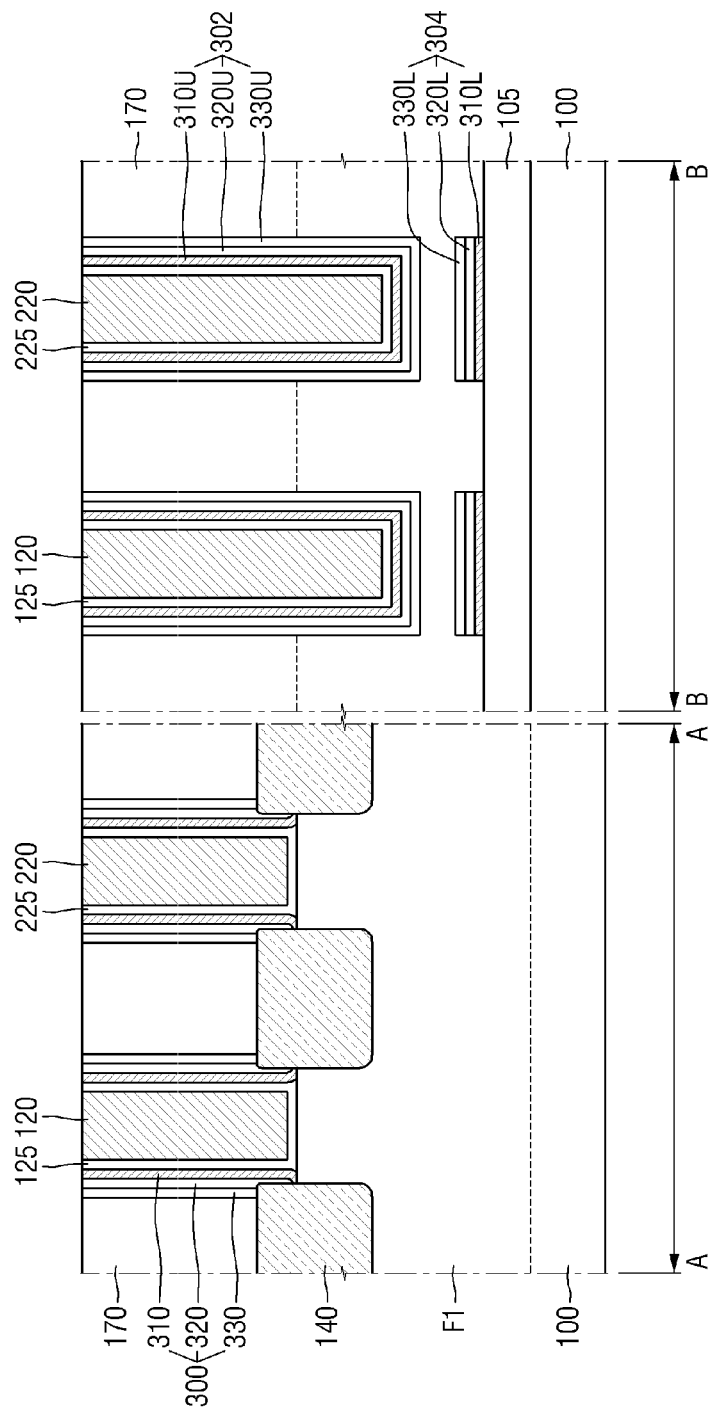

Referring to FIG. 23, a first gate insulating layer 125 may be formed along sidewalls and a bottom surface of the first trench 120t, and a second gate insulating layer 225 may be formed along sidewalls and a bottom surface of the second trench 220t.

A first gate electrode 120 may be formed on the first gate insulating layer 125 to be within and/or fill the first trench 120t, and a second gate electrode 220 may be formed on the second gate insulating layer 225 to be within and/or fill the second trench 220t.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
   a field insulating layer that is on a substrate;
   a gate structure that is on the substrate and separated from the field insulating layer;
   a first spacer structure that is on sidewalls and a lower surface of the gate structure and is separated from the field insulating layer; and
   a second spacer structure that is on a part of an upper surface of the field insulating layer that is overlapped by the gate structure.

2. The semiconductor device of claim 1, further comprising an interlayer insulating film between the first spacer structure and the second spacer structure.

3. The semiconductor device of claim 1, wherein the second spacer structure is on an area of the field insulating layer that is overlapped by the first spacer structure, and is not on at least part of the field insulating layer.

4. The semiconductor device of claim 1, wherein the first spacer structure comprises a first spacer upper layer that contacts the gate structure and a second spacer upper layer that is along an outer surface of the first spacer upper layer.

5. The semiconductor device of claim 4, wherein the second spacer structure comprises a first spacer lower layer that contacts the upper surface of the field insulating layer and a second spacer lower layer on an upper surface of the first spacer lower layer.

6. The semiconductor device of claim 5, wherein the first spacer upper layer and the first spacer lower layer comprise a first material, and the second spacer upper layer and the second spacer lower layer comprise a second material.

7. The semiconductor device of claim 5, further comprising a third spacer upper layer that extends on sidewalk and a lower surface of the second spacer upper layer and contacts an upper surface of the second spacer lower layer.

8. The semiconductor device of claim 1, wherein a first width of a lower surface of the first spacer structure is equal to or greater than a second width of an upper surface of the second spacer structure.

9. The semiconductor device of claim 1, wherein the field insulating layer comprises a void trench which is cut concavely into the field insulating, layer, and wherein a part of the second spacer structure is along an inner surface of the void trench.

10. The semiconductor device of claim ,1, further comprising an air gap between the first spacer structure and the second spacer structure.

* * * * *